United States Patent
Hilali et al.

(10) Patent No.: US 10,749,045 B1
(45) Date of Patent: Aug. 18, 2020

(54) SOLAR CELL SIDE SURFACE INTERCONNECTS

(71) Applicant: ZHEJIANG KAIYING NEW MATERIALS CO., LTD., Zhejiang (CN)

(72) Inventors: Mohamed M. Hilali, San Ramon, CA (US); Zhiyong Li, Los Altos, CA (US)

(73) Assignee: ZHEJIANG KAIYING NEW MATERIALS CO., LTD., Haining (CN)

( * ) Notice: Subject to any disclaimer, the term of this patent is extended or adjusted under 35 U.S.C. 154(b) by 0 days.

(21) Appl. No.: 16/847,501

(22) Filed: Apr. 13, 2020

Related U.S. Application Data

(63) Continuation-in-part of application No. 16/421,196, filed on May 23, 2019, now Pat. No. 10,622,502.

(51) Int. Cl.
  *H01L 31/05* (2014.01)
  *H01L 31/042* (2014.01)
  (Continued)

(52) U.S. Cl.
  CPC .... *H01L 31/0201* (2013.01); *H01L 31/02167* (2013.01); *H01L 31/0504* (2013.01)

(58) Field of Classification Search
  CPC .......... H01L 31/0201; H01L 31/02167; H01L 31/0504
  See application file for complete search history.

(56) References Cited

U.S. PATENT DOCUMENTS

| 7,300,606 B2 | 11/2007 | Chung et al. |
| 8,093,491 B2 | 1/2012 | Sridharan et al. |
(Continued)

FOREIGN PATENT DOCUMENTS

| CN | 101948639 | 1/2011 |
| CN | 102148264 | 8/2011 |
(Continued)

OTHER PUBLICATIONS

Benick et al., "High Efficiency n-type Si Solar Cells on Al2O3-Passivated Boron Emitters," Applied Physics Letters, 2008, Issue 92, p. 253504.
(Continued)

*Primary Examiner* — Jayne L Mershon

(57) ABSTRACT

Peripheral side surface interconnects for interconnecting solar cells are disclosed. The peripheral side surface interconnects include a layer of an electrically conductive adhesive overlying an insulating layer overlying a peripheral side edge of a solar cell and electrically interconnected to a busbar. Photovoltaic modules include adjacent solar cells comprising peripheral side surface interconnects interconnected by the electrically conductive adhesive or by the electrically conductive adhesive and an interconnection element. An interconnection element can be a solder paste or a solder containing electrically conductive ribbon. Methods of forming solar cell peripheral side surface interconnects include applying an insulating layer to a side surface of a solar cell, depositing a busbar in proximity to the insulated side surface of the solar cell, depositing an electrically conductive adhesive over at least a portion of the busbar and over at least a portion of the insulating layer. Photovoltaic modules can be formed by interconnecting adjacent solar cells using a peripheral side surface interconnect.

19 Claims, 15 Drawing Sheets

(51) Int. Cl.
*H01L 31/18* (2006.01)
*H01L 31/048* (2014.01)
*H01L 21/50* (2006.01)
*H01L 31/02* (2006.01)
*H01L 31/0216* (2014.01)

(56) References Cited

U.S. PATENT DOCUMENTS

| | | | |
|---|---|---|---|
| 8,952,245 | B2 | 2/2015 | Wang et al. |
| 9,209,323 | B2 | 12/2015 | Hayashi et al. |
| 9,834,470 | B1 | 12/2017 | Hilali et al. |
| 10,079,318 | B2 | 9/2018 | Hilali et al. |
| 2008/0202584 | A1* | 8/2008 | Basol .............. H01L 31/1884 |
| | | | 136/262 |
| 2009/0032087 | A1 | 2/2009 | Kalejs |
| 2010/0308462 | A1 | 12/2010 | Konno et al. |
| 2011/0120531 | A1 | 5/2011 | Nese et al. |
| 2011/0308597 | A1 | 12/2011 | Carroll et al. |
| 2011/0315217 | A1 | 12/2011 | Gee et al. |
| 2012/0000502 | A1* | 1/2012 | Wiedeman ......... H01L 31/0508 |
| | | | 136/244 |
| 2012/0015472 | A1 | 1/2012 | Hayashi et al. |
| 2012/0017986 | A1 | 1/2012 | Nakatani |
| 2012/0122272 | A1 | 5/2012 | Rana et al. |
| 2013/0118572 | A1 | 5/2013 | Kim et al. |
| 2013/0126797 | A1 | 5/2013 | Lee et al. |
| 2013/0255770 | A1 | 10/2013 | Carroll et al. |
| 2013/0340815 | A1 | 12/2013 | Kim et al. |
| 2013/0341769 | A1 | 12/2013 | Koehler et al. |
| 2014/0070148 | A1 | 3/2014 | Kim et al. |
| 2014/0124014 | A1 | 5/2014 | Morad et al. |
| 2014/0141164 | A1 | 5/2014 | Hofmann |
| 2014/0299187 | A1 | 10/2014 | Chang et al. |
| 2014/0338747 | A1 | 11/2014 | Choi et al. |
| 2014/0373898 | A1 | 12/2014 | Rogers et al. |
| 2015/0129030 | A1 | 5/2015 | Kapur et al. |
| 2015/0144183 | A1 | 5/2015 | Yang et al. |
| 2015/0200313 | A1* | 7/2015 | Moslehi ............ H01L 31/1804 |
| | | | 136/249 |
| 2015/0243807 | A1 | 8/2015 | Raskar et al. |
| 2015/0249167 | A1 | 9/2015 | Zhang et al. |
| 2015/0280024 | A1 | 10/2015 | Song et al. |
| 2015/0280641 | A1 | 10/2015 | Garg et al. |
| 2015/0333197 | A1 | 11/2015 | Takeda et al. |
| 2015/0364622 | A1 | 12/2015 | Jung et al. |
| 2016/0170192 | A1 | 6/2016 | Yamamoto et al. |
| 2016/0251531 | A1 | 9/2016 | Uchida et al. |
| 2017/0087633 | A1 | 3/2017 | Murano et al. |
| 2017/0306172 | A1 | 10/2017 | Koduma |

FOREIGN PATENT DOCUMENTS

| | | |
|---|---|---|
| CN | 102290120 | 12/2011 |
| CN | 102592708 | 7/2012 |
| CN | 102779575 | 11/2012 |
| CN | 103597547 | 2/2014 |
| CN | 104021836 | 9/2014 |
| CN | 104036842 | 9/2014 |
| CN | 104103699 | 10/2014 |
| CN | 104143385 | 11/2014 |
| CN | 104167454 | 11/2014 |
| CN | 104240793 | 12/2014 |
| CN | 104282357 | 1/2015 |
| CN | 104599741 | 5/2015 |
| CN | 104681648 | 6/2015 |
| CN | 104867535 | 8/2015 |
| CN | 104916346 | 9/2015 |
| CN | 104981911 | 10/2015 |
| CN | 105261669 | 1/2016 |
| CN | 205564774 | 9/2016 |
| CN | 106158068 | 11/2016 |
| CN | 106297956 | 1/2017 |
| JP | 2013-074165 | 4/2013 |
| KR | 20020060926 | 7/2002 |
| KR | 101377555 | 3/2014 |
| WO | 2012/135551 | 10/2012 |
| WO | 2016/194882 | 12/2016 |

OTHER PUBLICATIONS

Loozen et al., "Passivation of a Metal Contact with a Tunneling Layer," Energy Procedia, 3rd Workshop on Metallization for Crystalline Silicon Solar Cells, Belgium, 2012, Issue 21, p. 75-83.

Kim et al., "Capillary flow of amorphous metal for high performance electrode," Scientific Reports, 2013, vol. 3, No. 2185, 7 pages.

BYK-336 Silicone surface additive product data sheet, Sep. 2012, 1 page.

BYK Additives & Instruments Paint Additives, Feb. 2009, 15 pages.

Schmidt et al., "Surface Passivation of High-Efficiency Silicon Solar Cells by Atomic-Layer-Deposited Al2O3," Progress in Photovoltaics: Research and Applications, 2008, Issue 16, p. 461-466.

Sigma-Aldrich, Polymethylhydrosiloxane average Mx 1,700-3,200, Product 176206, CAS 63148-57-2, MDL MFCD00084478, 1 page.

Non-Final Office Action for U.S. Appl. No. 15/663,296, dated Sep. 14, 2017, 8 pages.

Non-Final Office Action for U.S. Appl. No. 15/663,187, dated Nov. 15, 2017, 6 pages.

Non-Final Office Action for U.S. Appl. No. 15/839,585, dated Feb. 5, 2018, 17 pages.

Non-Final Office Action for U.S. Appl. No. 15/849,344, dated Mar. 22, 2018, 12 pages.

Non-Final Office Action for U.S. Appl. No. 16/003,506, dated Aug. 26, 2019, 15 pages.

International Search Report and Written Opinion for Application No. PCT/CN2016/095508, dated May 5, 2017, 8 pages.

International Search Report and Written Opinion for Application No. PCT/CN2016/111036, dated Sep. 1, 2017, 9 pages.

International Search Report and Written Opinion for Application No. PCT/CN2016/111035, dated Sep. 27, 2017, 8 pages.

* cited by examiner

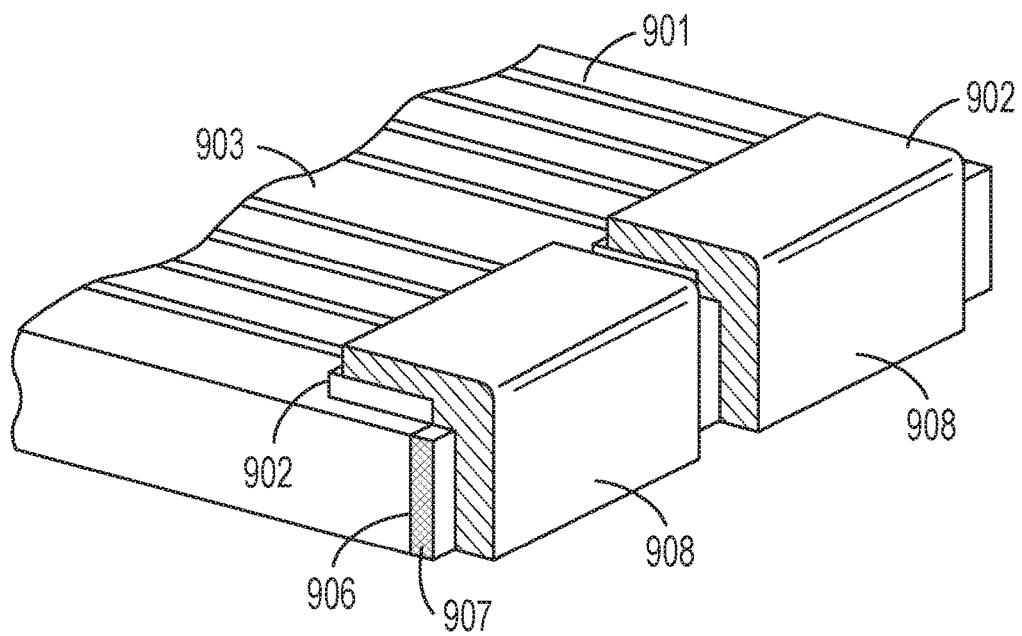
FIG. 9D
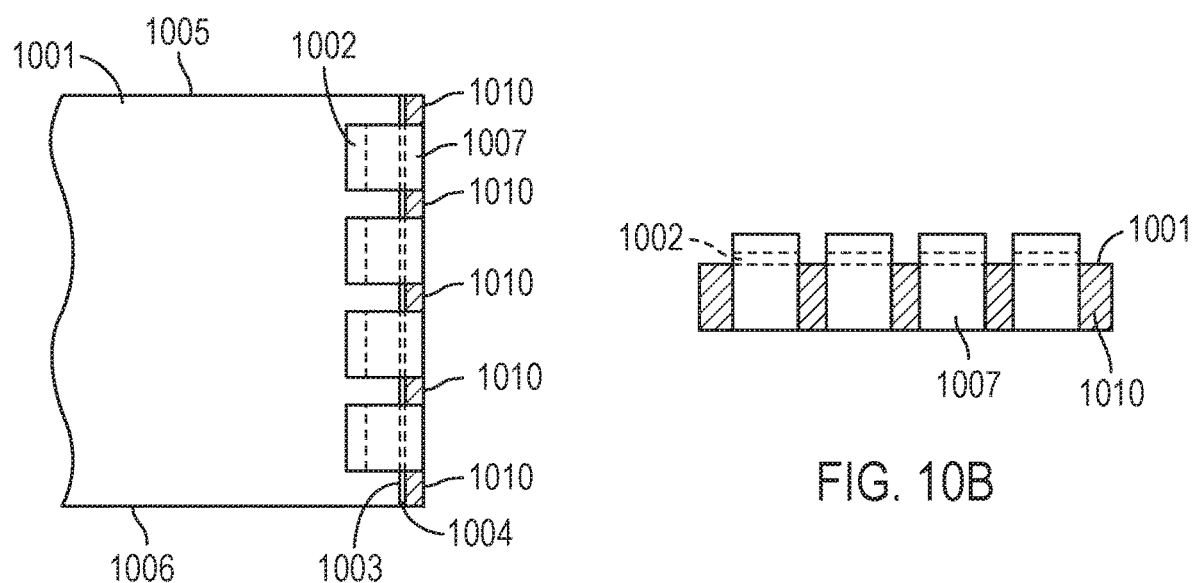
FIG. 10A
FIG. 10B

US 10,749,045 B1

SOLAR CELL SIDE SURFACE INTERCONNECTS

This application is a continuation-in-part of U.S. application Ser. No. 16/421,196 filed on May 23, 2019, which issued as U.S. Pat. No. 10,622,502, which is incorporated by reference in its entirety.

FIELD

The present invention relates to solar cell interconnects. The solar cell interconnects facilitate the ability of adjacent solar cells to be interconnected in a side-by-side configuration.

BACKGROUND

Adjacent solar cells can be interconnected using a solder-coated copper ribbon to interconnect busbars on a frontside surface of a first solar cell to busbars on a backside surface of a second subcell. Such interconnects leave a gap between adjacent solar cells from about 1 mm to about 2 mm. The ribbons are typically soldered to the busbars thereby potentially exposing the surface of the solar cell to excessive temperatures.

Reducing the gap between adjacent solar cells in a photovoltaic module can provide increased photovoltaic module power output and efficiency and minimizing the exposure of the solar cells to high temperatures during assembly of photovoltaic modules can improve the performance and long-term reliability of the photovoltaic modules.

SUMMARY

According to the present invention, a solar cell comprises: a substrate, wherein the substrate comprises a surface and a first peripheral side surface; one or more busbar segments disposed on the surface and in proximity to the first peripheral side surface; an insulating layer overlying at least a portion of the first peripheral side surface; and an electrically conductive adhesive overlying at least a portion of the insulating layer and overlying at least a portion of each of the one or more busbar segments.

According to the present invention, a photovoltaic module comprises: a first solar cell according to the present invention comprising one or more first frontside busbar segments and a first electrically conductive adhesive; and a second solar cell according to the present invention comprising one or more second backside busbar segments and a second electrically conductive adhesive; wherein the first electrically conductive adhesive and the second electrically conductive adhesive are bonded and electrically interconnect the one or more first frontside busbar segments to the one or more second backside busbar segments.

According to the present invention, a photovoltaic module comprises: a first solar cell, wherein the first solar cell comprises a first frontside surface, a first backside surface, a first peripheral side surface, one or more frontside busbar segments disposed on the first frontside surface and in proximity to the first peripheral side surface, and a first insulating layer overlying the first peripheral side surface; a second solar cell, wherein the second solar cell comprises a second frontside surface, a second backside surface, a second peripheral side surface, one or more backside busbar segments disposed on the second backside surface and in proximity to the second peripheral side surface, and a second insulating layer overlying the second peripheral side surface; and an electrically conductive adhesive disposed on the first insulating layer and on the second insulating layer and overlying at least a portion of the one or more first frontside busbar segments and overlying at least a portion of the one or more backside busbar segments.

According to the present invention, a photovoltaic system comprises two or more photovoltaic modules according to the present invention.

According to the present invention, a method of fabricating a solar cell interconnect, comprises: depositing an insulating layer overlying a peripheral side surface of a solar cell; and depositing an electrically conductive adhesive overlying at least a portion of the insulating layer and overlying at least a portion of each of one or more busbar segments to provide a solar cell interconnect.

According to the present invention, a solar cell comprises an interconnect fabricated using a method according to the present invention.

According to the present invention, a method of interconnecting solar cells comprises: contacting a first electrically conductive adhesive of a first solar cell according to the present invention to a second electrically conductive adhesive of a second solar cell according to the present invention; and bonding the first electrically conductive adhesive to the second electrically conductive adhesive to interconnect the first solar cell and the second solar cell.

According to the present invention, solar cells are interconnected using a method according to the present invention.

According to the present invention, a photovoltaic module comprises solar cells according to the present invention.

According to the present invention, a power system comprises a plurality of photovoltaic modules according to the present invention.

According to the present invention, solar cell comprises: a substrate comprising a frontside surface, a backside surface, a first peripheral side surface, and a second peripheral side surface; a side surface insulating layer overlying the first peripheral side surface; a backside insulating layer overlying a portion of the backside surface in proximity to the first peripheral side surface; one or more frontside busbar segments overlying the backside insulating layer; and a plurality of frontside gridlines disposed on the frontside surface and interconnected to the one or more frontside busbar segments.

According to the present invention, methods of fabricating a solar cell interconnect comprise applying an insulating layer to a peripheral side surface of a solar cell; and extending gridlines on a frontside surface of the solar cell over the insulating layer and onto one or more busbar segments on a backside surface of the solar cell.

BRIEF DESCRIPTION OF THE DRAWINGS

Those skilled in the art will understand that the drawings described herein are for illustration purposes only. The drawings are not intended to limit the scope of the present disclosure.

FIGS. 9A-9D show views of an example of a side surface interconnect provided by the present disclosure.

FIGS. 10A-10B show views of an example of a side surface interconnect with elastomer elements disposed on a peripheral side surface adjoining electrically conductive adhesive provided by the present disclosure.

DETAILED DESCRIPTION

Figure 1A:
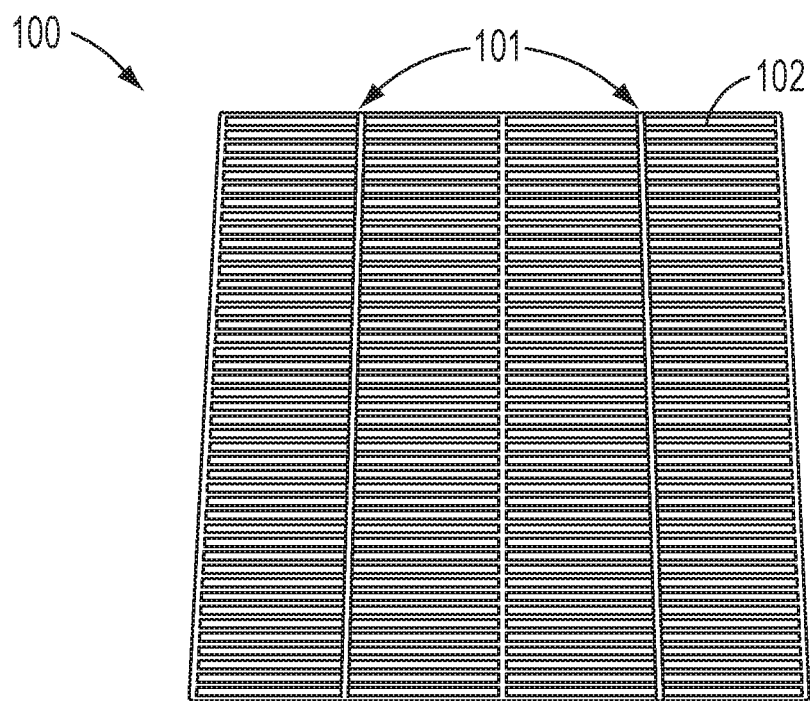
FIGS. 1A and 1B show the frontside (1A) and backside (1B) surfaces of a large area solar cell, which can be cut longitudinally to provide four (4) small area solar cells of equal size.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized, and structural, logical, and electrical changes may be made without departing from the scope of the invention. The various embodiments disclosed herein are not necessarily mutually exclusive, as some disclosed embodiments may be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

"Interconnect," "interconnected," and "interconnecting" refers to electrical interconnection.

"Frontside surface" as in the frontside surface of a solar cell refers to the surface of the solar cell facing incident radiation.

"Backside surface" as in the backside surface of a solar cell refers to the surface of the solar cell facing away from incident radiation.

"Peripheral side surface" as in the peripheral side surface of a solar cell refers to the outer side surfaces of a solar cell. The peripheral side surfaces extend from an edge of the frontside surface to a respective edge of the backside surface of a solar cell. FIG. 2B shows peripheral side surfaces 205a, 205c. and 205d. In FIG. 2C, peripheral side surface 205d is bounded by frontside surface 201, peripheral side surface 205a, backside surface 206 and peripheral side surface 205c. FIG. 2C shows a side-on view of peripheral side surface 205a, which is bounded by front surface 201, peripheral side surface 205b, backside surface 206, and peripheral side surface 205d. The solar cell shown in FIGS. 2A-2C has four peripheral side surfaces. A solar cell can have other shapes which can have a different number of peripheral side surfaces such as, for example, three or six peripheral side surfaces.

"Respective" as in respective busbars refers to interconnected busbars.

"Commensurate" means in alignment with and having similar dimensions.

"Overlying" means over. For example, a second layer that overlies a first layer can lie adjacent or adjoin the first layer, or there can be an intervening material and/or structure between the first layer and the second layer. Overlying encompasses the term "against."

"Adjacent" means against, on, or contacting without any intervening material or structure.

"In proximity to" means near, a short distance away from, or close. A feature that is in proximity to an edge can be near, a short distance away from, close to the edge; or can be at the edge.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

The use of small-area solar cells can increase the power output and the efficiency of a photovoltaic system. A typical large-area solar cell can have dimensions, for example, of about 156 mm×156 mm. Small-area solar cells can have an area that is, for example, less than 25%, 20%, or 15% the area of a large-area solar cell. Because the gridlines are shorter, the series resistance is reduced, and the busbars can be situated in proximity to a peripheral side edge of the solar cell. For example, because power loss due to series resistance (R) is related as $P_{loss}=I^2R$ the power loss can be significantly reduced and the fill factor (F) and efficiency improves with small-area solar cells. Thus, for example, by reducing the area of a solar cell by 50% the power loss due to the cell resistance can be reduced by 25%.

Figure 1B:
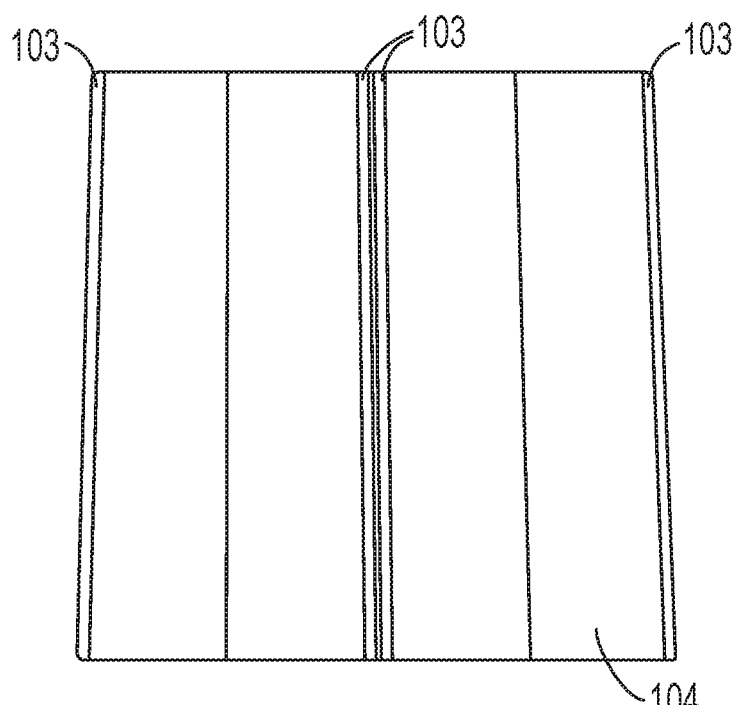

FIGS. 1A and 1B show a frontside (1A) and a backside (1B) of a large area solar cell 100 including frontside busbars 101, frontside gridlines 102, backside busbars 103, and backside contact 104. Large area solar cells are manufactured in high volume and are cost-effective to produce. Small-area solar cells can be fabricated, for example, by laser cutting a large-area solar cell into four (4) or more small-area solar cells. Other sizes of small area solar cells can be cut from large area solar cells. For example, a large area solar cell having three busbars on the frontside surface and can be cut into six small area solar cells. Small area solar cells can be cut from a large area solar cell can have dimensions, for example, of 156 mm×39 mm or of 156 mm×26 mm A small area solar cell can have a surface area, for example, from 500 mm$^2$ to 10,000 mm$^2$, from 2,000 mm$^2$ to 8,000 mm$^2$, from 3,000 mm$^2$ to 7,000 mm$^2$, or from 4,000 mm$^2$ to 6,000 mm$^2$. To provide small area solar cells, a large area solar cell can be cut in the middle of the busbars such that each of the small area solar cells has busbars at two peripheral side edges.

Adjacent small-area solar cells can be interconnected using conductive ribbon. For a conductive ribbon interconnect, a certain distance is required between adjacent solar cells to maintain electrical isolation between opposing peripheral side surfaces. The distance between the opposing peripheral side surfaces of adjacent solar cells can be, for example, from 1 mm to 2 mm. Alternatively, in a shingled solar cell configuration a backside busbar of an overlying solar cell is directly interconnected to a frontside busbar of an underlying solar cell resulting in the interconnected solar cells having a non-planar configuration. As a result, for shingled solar cells there is a shadowing loss due to the extension of the overlying photovoltaic module above the surface of the underlying solar cell. Thus, in both configurations the active cell area per photovoltaic module area is reduced to various degrees by the interconnects. When multiplied over multiple small-area solar cells used to form a photovoltaic module, the reduction in power per surface area can be significant.

Thus, to employ small-area solar cells to advantage, improved interconnects are desired.

The active area of a photovoltaic module can be increased by minimizing the separation between the opposing peripheral side surfaces of adjacent, interconnected solar cells. Solar cell interconnects provided by the present disclosure can be used to increase the active solar cell area and thereby increase the power output and efficiency of photovoltaic power modules formed using small-area solar cells.

Solar cell interconnects provided by the present disclosure include peripheral side surface interconnects and backside interconnects.

A peripheral side surface solar cell interconnect provided by the present disclosure can include a first electrically conductive adhesive overlying a peripheral side surface of a first solar cell and interconnected to a busbar, a second electrically conductive adhesive overlying a peripheral side surface of a second solar cell and interconnected to a busbar, and an interconnection element interconnecting the first and second electrically conductive adhesives.

A peripheral side surface solar cell interconnect provided by the present disclosure can include an electrically conductive adhesive interconnecting a busbar on the surface of a first solar cell to a second busbar on a second solar cell.

A backside solar cell interconnect provided by the present disclosure can include a configuration in which a frontside busbar is disposed on the backside surface of a solar cell and the frontside gridlines extend over the peripheral side surface and interconnect to the frontside busbar overlying the backside surface. The frontside busbar of a first solar cell can be interconnected to a backside surface of a second solar cell by Solar cell interconnects provided by the present disclosure can be used with a solar cell having any suitable dimensions and in particular small area solar cells. For example, solar cell interconnects provided by the present disclosure can be used to interconnect small area solar cell having surface areas from 500 mm$^2$ to 10,000 mm$^2$. Solar cell interconnects provided by the present disclosure can be used to interconnect solar cells having surface areas less than that of a large area solar cell. For example, a solar cell interconnect provided by the present disclosure can be used to interconnect solar cells having a surface area from 500 mm$^2$ to 10,000 mm$^2$, from 1,000 mm$^2$ to 8,000 mm$^2$, from 2,000 mm$^2$ to 7,000 mm$^2$, or from 3,000 mm$^2$ to 7,000 mm$^2$. A solar cell interconnect provided by the present disclosure can be used to interconnect solar cells having a surface area less than 10,000 mm$^2$, less than 8,000 mm$^2$, less than 6,000 mm$^2$, less than 4,000 mm$^2$, or less than 2,000 mm$^2$ The solar cell interconnects provided by the present disclosure allow adjacent solar cells to be interconnected in a planar, side-by-side configuration, such that when interconnected a peripheral side surface of one solar cell faces a peripheral side surface of an adjacent solar cell.

Side surface interconnects provided by the present disclosure can be used to interconnect any suitable solar cell. Examples of suitable solar cells include conventional Al-BSF (back surface field) solar cells, P-type PERC (passivated emitter rear contact) solar cells, N-PERT (passivated emitter rear totally diffused) solar cells, HIT (heterojunction with intrinsic thin layer) solar cells and TopCon (tunnel oxide passivated contact) solar cells A solar cell can comprise gridlines and busbars formed using any suitable material. For example, gridlines and busbars can be formed from screen-printed metallization pastes such as silver metallization pastes. Gridlines and busbars can have any suitable dimensions. The material forming the busbars can be configured to facilitate the formation of a low resistivity and mechanically and environmentally robust interconnect to an electrically conductive adhesive.

Figure 2A:
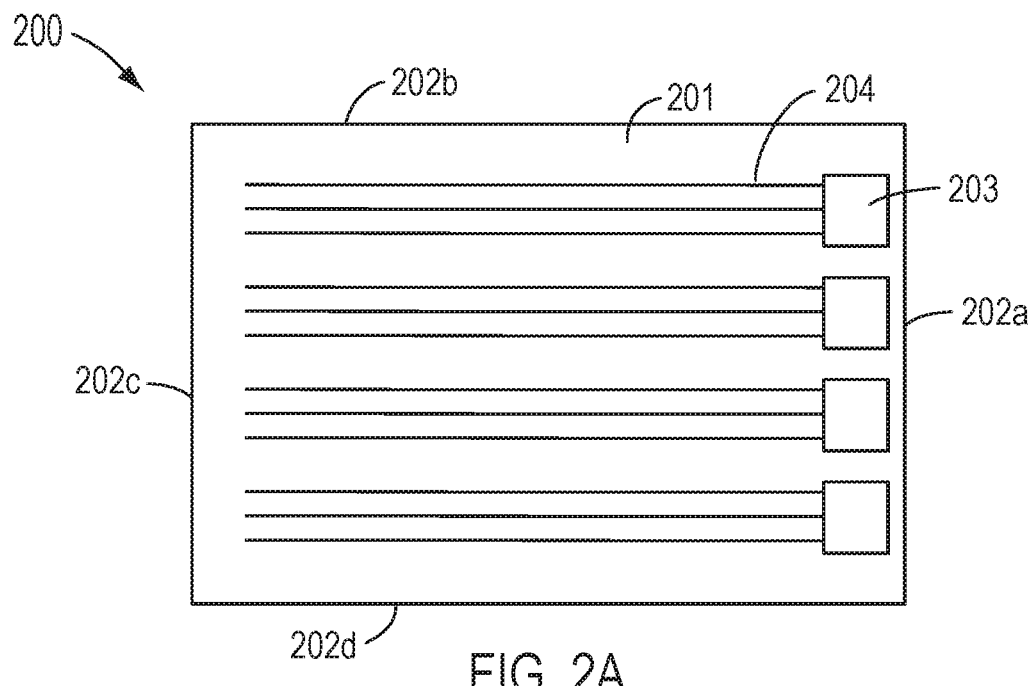
FIGS. 2A-2C show views of a solar cell.
Figure 2B:
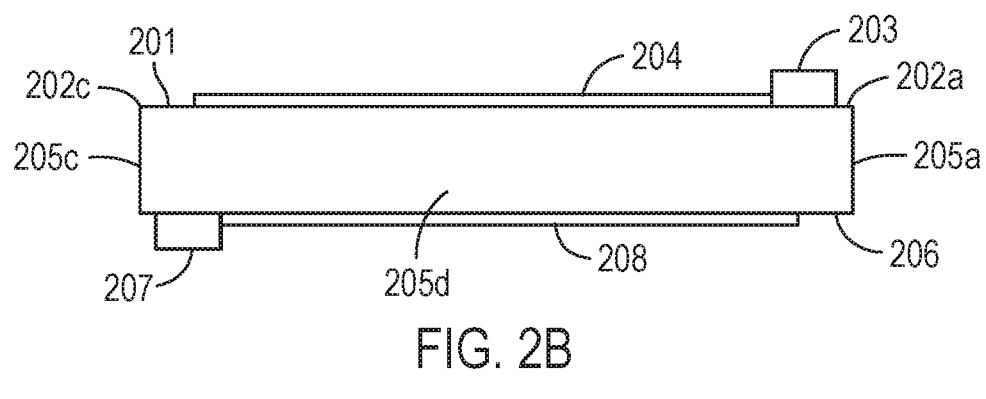
Figure 2C:
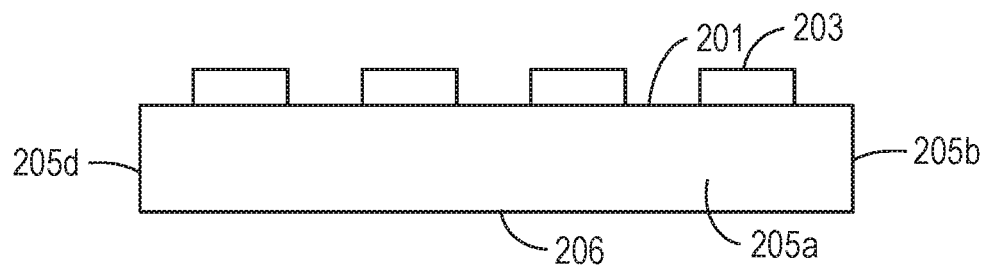

Top and side views of a solar cell are shown in FIGS. 2A-2C.

FIG. 2A shows a view of the frontside surface 201 of a solar cell 200 including a busbar comprising a plurality of busbar segments 203 disposed in proximity to a first peripheral side edge 202a of the solar cell. A second peripheral side edge 202c is opposite the first peripheral side edge 202a and peripheral side edges 202b and 202d are orthogonal to side edges 202a and 202c. A plurality of grid lines 204 are interconnected to frontside busbar segments 203.

FIG. 2B shows a side view of the solar cell shown in FIG. 2A. FIG. 2B shows a frontside surface 201 of solar cell 200, a backside surface 206, a first peripheral side surface 205a, a frontside busbar 203 disposed in proximity to frontside peripheral side edge 202a and to peripheral side surface 205a, and a plurality of frontside gridlines 204 disposed on the frontside surface 201 and interconnected to busbar 203. Peripheral side surface 205a extends from backside surface 206 to frontside peripheral side edge 202a. Backside busbar 207 and a plurality of backside gridlines 208 are disposed on the backside surface 206. Backside busbar 207 is in proximity to second peripheral side surface 205c.

It will be appreciated that depending on the type of solar cell, a backside surface of a solar cell can include a busbar overlying a portion of the backside surface with gridlines interconnected to the busbar, or the backside surface can include a conductor such as an aluminum conductor covering the entire backside surface of a solar cell. When reference is made to a configuration having a backside busbar, it will be understood that the configuration can equally apply to a solar cell having a backside conductor covering the entire backside surface. For example, an aluminum conductor covers the full back surface of a conventional Al back-surface field (BSF) solar cell; whereas p-type PERC solar cells, and N-type PERT solar cells have gridlines interconnected to a busbar on the backside surface of the solar cell.

FIG. 2C shows a view of peripheral side surface 205a including frontside surface 201, backside surface 206, and frontside busbar including busbar segments 203. Peripheral side surface 205a is bounded by peripheral side surface 205b and peripheral side surface 205d.

A side surface solar cell interconnect provided by the present disclosure can comprise an electrically conductive adhesive (ECA) interconnecting two solar cells and is referred to as a side surface ECA interconnect. A side surface ECA interconnect does not include an interconnection element other than the ECA.

Figure 3A:
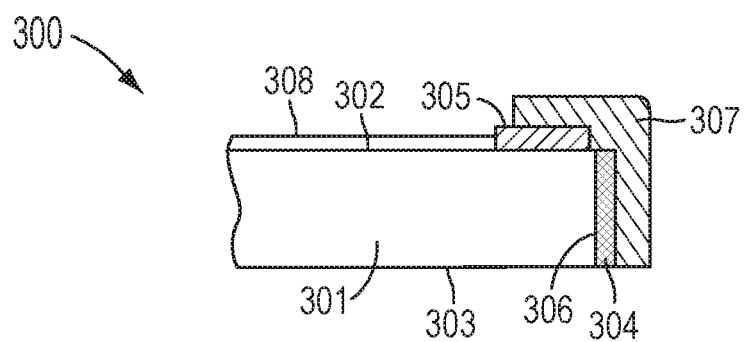
FIG. 3A shows a cross-sectional view of an example of a solar cell interconnect provided by the present disclosure.

A cross-sectional view of a portion of a solar cell comprising an ECA side surface interconnect provided by the present disclosure is shown in FIG. 3A. As shown in FIG. 3A, a solar cell 300 includes a substrate 301, a frontside surface 302, a backside surface 303, and a peripheral side surface 306. An insulating layer 304 overlies the peripheral side surface 306. A frontside busbar 305 is disposed on the frontside surface 302 of the solar cell in proximity to peripheral side surface 306. Gridlines 308 are disposed on the frontside surface 302 and are interconnected to frontside busbar 305. An electrically conductive adhesive 307 overlies the insulating layer 304 and at least a portion of the frontside busbar 305.

Figure 3B:
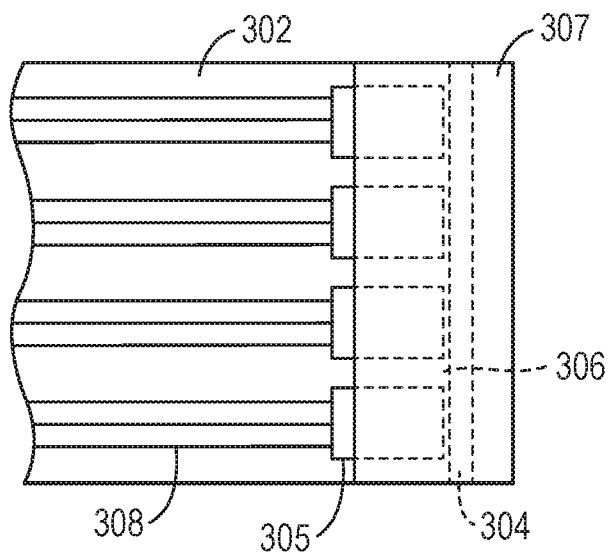
FIG. 3B shows a top view of an example of a solar cell side surface interconnect provided by the present disclosure.

A top view of the solar cell interconnect of FIG. 3A is shown in FIG. 3B. FIG. 3B shows a view of the frontside of the solar cell including frontside surface 302, peripheral side surface 306, insulating layer 304 overlying the peripheral side surface 306, and frontside busbar comprising busbar segments 305 overlying frontside surface 302 and in proximity to peripheral side surface 306. Gridlines 308 are disposed on the frontside surface 302 and are interconnected to busbar segment s 305. Electrically conductive adhesive 307 overlies insulating layer 304 and frontside busbar segments 305.

Figure 3C:
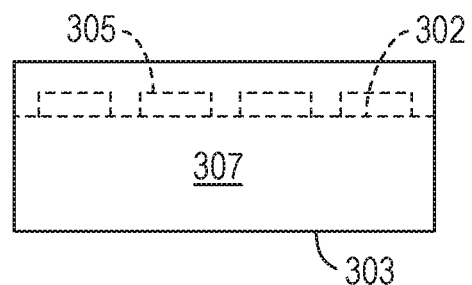
FIG. 3C shows a side view of an example of a solar cell side surface interconnect provided by the present disclosure.

FIG. 3C shows a top view of the solar cell shown in FIGS. 3A and 3B with an electrically conductive adhesive 307 overlying the peripheral side surface 306 of the solar cell and overlying the frontside busbar segments 305.

Figure 3D:
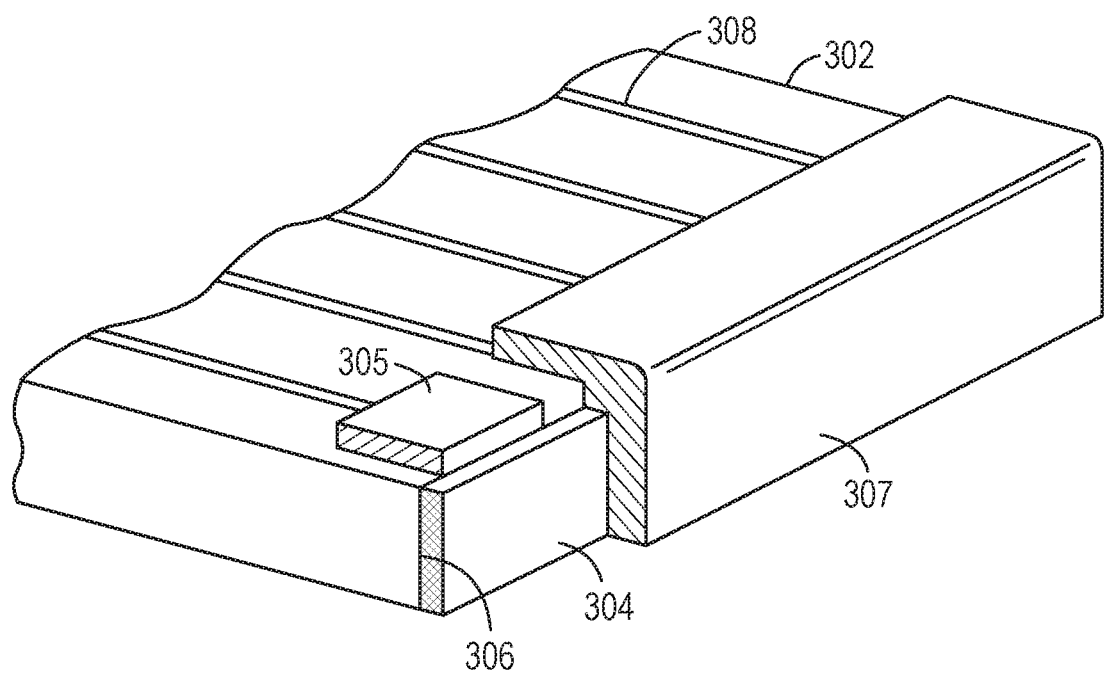
FIG. 3D shows a perspective view of an example of a solar cell side surface interconnect provided by the present disclosure.

FIG. 3D shows a perspective composite view of the solar cell peripheral side surface interconnect shown in FIGS. 3A-3C. The elements are identified as for FIGS. 3A-3C. FIG. 3D shows a cut-away portion of the electrically conductive adhesive 307 overlying the insulating layer 304 and a frontside busbar 305 in proximity to peripheral side surface 306. Gridlines 308 on frontside surface 302 are interconnected to busbar 305.

An electrically insulating layer isolates the peripheral side surface of the solar cell from the overlying electrically conductive adhesive. The interface between the insulating layer and the overlying ECA is mechanically and environmentally robust under typical solar cell use conditions.

An electrically insulating layer can comprise any suitable electrically insulating material, such as an organic or inorganic material. Examples of suitable inorganic materials include polyimides, fluoropolymers, polyetheretherketones, and polyetherimides. Examples of suitable inorganic materials include oxides such as silicon oxide. An insulating material can comprise a dielectric material such as, for example, silicon nitride.

An electrically insulating layer can be applied to a peripheral side surface of a solar cell using any suitable method. For example, an electrically insulating layer can be deposited using additive manufacturing or by vapor deposition. For example, an inorganic insulating layer can be deposited using metallo-organic chemical vapor deposition.

An insulating layer can comprise an organic material or an inorganic material such as a dielectric material. An insulating layer can have a thickness, for example, less than 200 nm, less than 100 nm, less than 50 nm, or less than 20 nm. An insulating layer can have a thickness, for example, from 10 nm to 100 nm, such as from 20 nm to 80 nm, or from 30 nm to 60 nm.

An insulating layer can be a dielectric layer and can comprise, for example, $SiO_2$, $Si_3N_4$, or $Al_2O_3$.

A dielectric layer can be deposited on the peripheral side surface of a solar cell using any suitable semiconductor deposition method such as, for example, plasma enhanced chemical vapor deposition, metal-organic chemical vapor deposition, or molecular beam epitaxy.

When a copper-containing electrically conductive adhesive is used, it can be desirable that the insulating layer such as a dielectric layer also serve to prevent diffusion of copper from the electrically conductive adhesive into the active region of the solar cell. Elements such as phosphorus, gold, zinc, carbon, magnesium, indium, titanium, vanadium, chromium, manganese, iron, cobalt, nickel, zirconium, niobium, molybdenum, tantalum and tungsten, can also diffuse into silicon and create recombination centers. Dielectric materials that can serve as a diffusion barrier include, for example, tungsten carbide ($W_2C$), titanium silicon nitride (TiSiN), $ZrB_2$, and amorphous $MnSi_xO_y$. This dielectric layer can also passivate the edges of the silicon solar cells, thereby mitigating edge recombination effects. These diffusion barriers can be electrically insulating and can be deposited by chemical vapor deposition (CVD), which is a conformal coating process. Alternatively, other diffusion barriers such as tantalum nitride can be used/deposited using other semiconductor deposition methods such as physical vapor deposition (PVD), which is not a conformal coating process.

An electrically conductive adhesive can be ay suitable electrically conductive adhesive used to fabricate solar cells.

Electrically conductive adhesives used for solar cell fabrication can comprise, for example, an electrically conductive metal such as silver particles and a thermosetting resin.

A suitable electrically conductive adhesive can have a binder comprising a blocked polyisocyanate prepolymer as the primary or one of the primary constituents. Examples of suitable blocked isocyanates include alcohol blocked, phenol blocked, caprolactam blocked, pyrazol blocked, uretidione blocked, ketoximine blocked, amide blocked, imidazole blocked and malonate blocked-polyisocyanate. The blocked polyisocyanates can be unblocked with exposed to elevated temperatures.

A suitable electrically conductive adhesive can comprise a polyepoxide resin. Examples of suitable polyepoxide resins include bisphenol A type polyepoxides, brominated bisphenol A type polyepoxides, bisphenol F type polyepoxides, biphenyl type polyepoxides, novolac type polyepoxides, an alicyclic polyepoxides, naphthalene type polyepoxides, ether series or polyether series polyepoxides, oxirane ring-containing polybutadienes, silicone polyepoxide copolymers, and a combination of any of the foregoing.

An electrically conductive adhesive can comprise, for example, silver particles, copper particles, or combinations thereof. An electrically conductive adhesive can comprise, for example, from 60 wt % to 95 wt % of electrically conductive particles, where wt % is based on the weight of the electrically conductive adhesive. The electrically conductive particles can have an average particle diameter (d50), for example, from 0.5 µm to 25 µm. The electrically conductive particles can also include metal-coated particles such as metallic glass, or polymeric particles that are coated with an electrically conductive metal such as Au, Ag, Ni, and/or Cu.

When cured, an electrically conductive adhesive can have a cured thickness, for example, from 20 µm to 200 µm, from 20 µm to 150 µm, from 20 µm to 100 µm, or from 20 µm to 60 µm. A cured electrically conductive adhesive can have a thickness, for example, less than 200 µm, less than 150 µm, less than 100 µm, or less than 50 µm.

An electrically conductive adhesive can comprise a curable resin. The polymer matrix can comprise one or more polymers such as (meth)acrylate copolymers, polyesters, polyurethanes, polysiloxanes, polyethers, epoxy-amine-polyadducts, and combinations of any of the foregoing. The resin systems can be thermally curable. For example, the resin system can be curable at a temperature from 110° C. to 230° C.

Elastomeric polymers such as ethylene copolymer-based (such as those based on ethylene vinyl acetate (EVA) can also be used, for example, in an alternating pattern with the electrically conductive adhesive (ECA) on the peripheral side surface of the solar cell.

The electrically conductive adhesive can comprise, for example, copper, a copper alloy, silver, a silver alloy, nickel, a nickel alloy, or a combination of any of the foregoing.

An electrically conductive adhesive can comprise Cu and/or Ag pastes that can be cured at low temperatures such as from 120° C. to 230° C., from 150° C. to 200° C., or from 160° C. to 180° C. The electrically conductive adhesive can be curable at temperatures less than 250° C., less than 200° C., less than 150° C. or less than 100° C. Electrically conductive adhesives can be designed to provide an elastic interface to reduce mechanical stress between the solar cell interconnect and the interconnected solar cell.

Examples of suitable electrically conductive adhesives include DD-1662K® series suitable for nozzle/syringe dispensing (commercially available from Kyoto Elex Co., Ltd.).

Examples of suitable solder pastes include Loctite® HF 250DP suitable for nozzle/syringe dispensing-type applications (commercially available from Henkel).

An electrically conductive adhesive can comprise, for example, an epoxy resin, a polyimide resin acrylic resin, or a polycarbonate resin.

Figure 4:
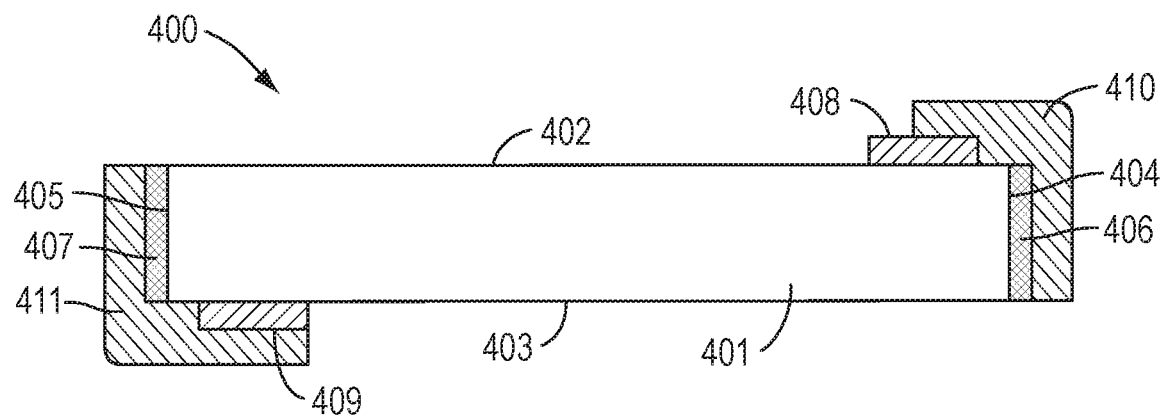
FIG. 4 shows a cross-sectional view of an example of a solar cell having two side surface interconnects provided by the present disclosure.

FIG. 4 shows a solar cell having two peripheral side surface interconnects.

FIG. 4 shows a solar cell 400 having a substrate 401, a frontside surface 402, a backside surface 403, a first peripheral side surface 404, and a second peripheral side surface 405. A first insulating layer 406 overlies the first peripheral side surface 404, and a second insulating layer 407 overlies the second peripheral side surface 405. A frontside busbar 408 is disposed on the frontside surface 402 in proximity to the first peripheral side surface 404 and a backside busbar 409 is disposed on the backside surface 403 in proximity to the second peripheral side surface 407. A first electrically conductive adhesive 410 overlies the first insulating layer 406 and the frontside busbar 408, and a second electrically conductive adhesive 411 overlies the second insulating layer 407 and the backside busbar 409.

In FIG. 4 an electrically conductive adhesive is shown on two peripheral side surfaces. A solar cell provided by the present disclosure can have an ECA side surface interconnect on one peripheral side surface, or on two or more peripheral side surfaces.

A photovoltaic module can comprise two or more solar cells comprising a peripheral side surface interconnect provided by the present disclosure and interconnecting the two or more solar cells.

Figure 5:
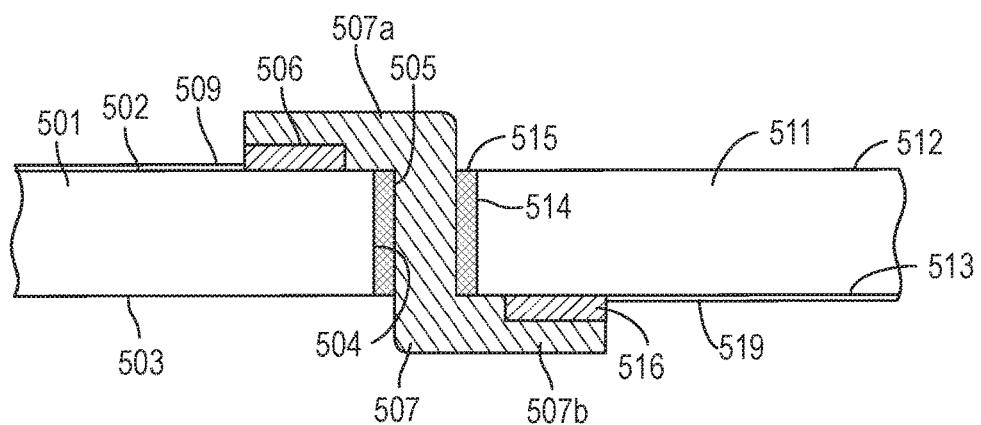
FIG. 5 shows a cross-sectional view of two solar cells interconnected by a side surface interconnect provided by the present disclosure.
Figure 6:
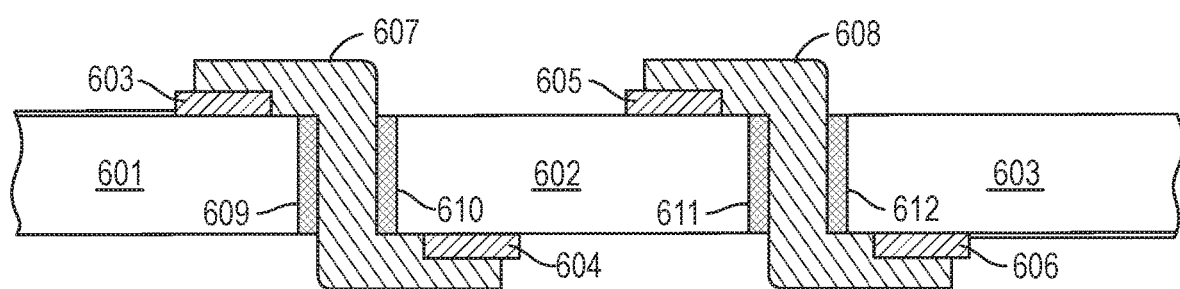
FIG. 6 shows a cross-sectional view of three solar cells interconnected by side surface interconnects provided by the present disclosure.

Photovoltaic modules comprising two solar cells interconnected using a peripheral side surface interconnect is shown in FIG. 5 and in FIG. 6.

FIG. 5 shows a first solar cell 501 and a second solar cell 511 interconnected through electrically conductive adhesive 507. First solar cell 501 includes a frontside surface 502, a backside surface 503, and a peripheral side surface 504 with overlying insulating layer 505. Frontside busbar 506 overlies frontside surface 502 in proximity to peripheral side surface 504. Second solar cell 511 includes a frontside surface 512, a backside surface 513, and a peripheral side surface 514 with overlying insulating layer 515. Backside busbar 516 overlies backside surface 513 in proximity to peripheral side surface 514. The frontside gridlines 509 on the frontside surface 502 of the first solar cell 501 are interconnected to frontside busbar 506. Backside conductor or gridlines 519 on the backside surface 513 of the second solar cell 511 are interconnected to backside busbar 516. Electrically conductive adhesive 507 interconnects the first solar cell 501 to the second solar cell 511 via frontside busbar 506, electrically conductive adhesive 507, and backside busbar 516. Electrically conductive adhesive 507 can be formed by bonding the electrically conductive adhesive 507a/507b between the two solar cells.

A photovoltaic module can comprise two or more solar cells interconnected by a peripheral side surface interconnect provided by the present disclosure. FIG. 6 shows an example where three solar cells are interconnected.

FIG. 6 shows three solar cells, solar cells 601, 602, and 603 interconnected with an ECA peripheral side surface interconnect provided by the present disclosure. As shown in FIG. 6, a frontside busbar 603 of first solar cell 601 is interconnected to backside busbar 604 of second solar cell 602 through ECA 607, and frontside busbar 605 of second solar cell 602 is interconnected to backside busbar 606 of third solar cell 603 through ECA 608. ECA 607 is insulated from first solar cell 601 by insulating layer 609 and from second solar cell 602 by insulating layer 610. ECA 608 is insulated from second solar cell 602 by insulating layer 611 and from third solar cell 603 by insulating layer 612.

A busbar can comprise one or more busbar segments. A busbar can comprise a segmented busbar. A busbar can comprise a stripe of conductive material disposed in proximity to a peripheral side edge of a solar cell, such as at a peripheral side edge of a solar cell. A busbar can be a segmented busbar and can comprise two or more areas of conductive material disposed in proximity to a peripheral side edge of a solar cell, such as at a peripheral side edge of a solar cell. A busbar can comprise an electrically conductive material or layer of conductive material such as an aluminum-containing layer that covers substantially the entire surface of a solar cell.

Figure 7A:
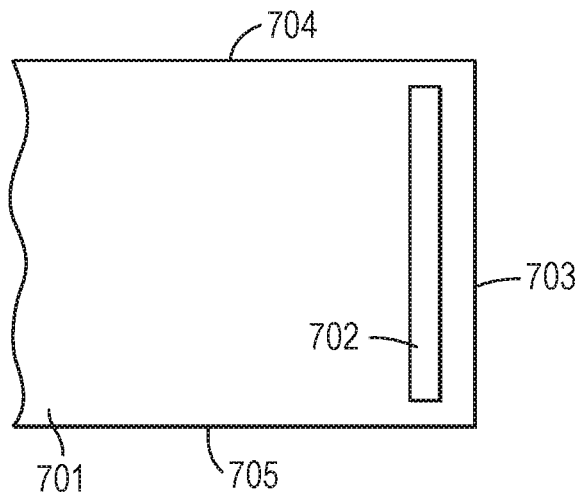
FIGS. 7A-7B show top and side views of an example of a solar cell.
Figure 7B:
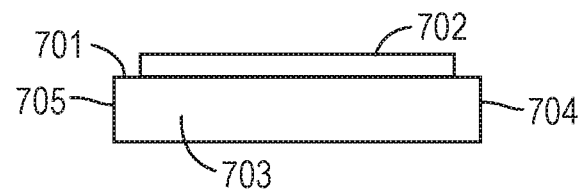

A frontside busbar and/or backside busbar of a solar cell can be disposed in proximity to a peripheral side surface and can extend the entire length of the solar cell surface or a substantial length of the solar cell surface in proximity to the peripheral side surface. By substantially the entire length of the solar cell surface means that a busbar need not end against an orthogonal side edge but that there can be some space between the busbar and the orthogonal side edge. Top and side views of a solar cell having a single busbar are shown in FIGS. 7A and 7B respectively. FIGS. 7A and 7B include solar cell surface 701 and a single busbar 702 in proximity to peripheral side surface 703. Single busbar 702 extends substantially the entire length of the periphery of the solar cell between peripheral side surfaces 704 and 705. As shown in FIGS. 7A and 7B there can be a small gap between the orthogonal peripheral side edges 704/705 and the busbar 702.

Figure 8A:
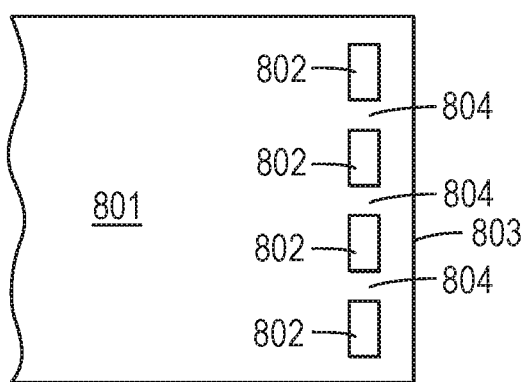
FIGS. 8A-8B show top and side views of an example of a solar cell.
Figure 8B:
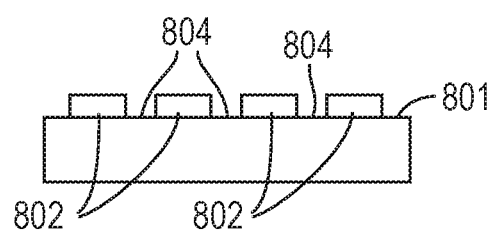

A segmented busbar can include two or more busbar segments. Each of the two or more busbar segments can be disposed on a first portion of solar cell surface in proximity to a peripheral side surface. A second portion of the surface is between adjacent busbars. This is shown in FIGS. 8A and 8B, which include four busbar segments 802 disposed on a first portion of solar cell surface 801 in proximity to peripheral side surface 803. A second portion 804 of solar cell surface 801 is between each adjacent busbar segment 802. For example, FIGS. 8A and 8B show busbar segment 802 overlying first portions of surface 801 with second portions 804 between adjacent busbar segments 802.

In solar cell interconnects provided by the present disclosure, the electrically conductive adhesive can span substantially the entire length of the peripheral side surface of a solar cell.

The electrically conductive adhesive can overlie substantially the entire length of the peripheral side surface of a solar cell and overlie a substantial portion of a single busbar segment or busbar segments or overlie only certain portions of a busbar or busbar segments. These embodiments are illustrated in FIGS. 3A and 3B. FIG. 3A shows the electrically conductive adhesive 307 overlying substantially the entire peripheral side surface 306 and the entire single busbar segment 305. FIG. 3B shows electrically conductive adhesive 307 overlying substantially the entire peripheral side surface 306 and multiple busbar segments 305.

In embodiments comprising two or more busbar segments the electrically conductive adhesive can overly a commensurate portion of the peripheral side surface.

Figure 9A:
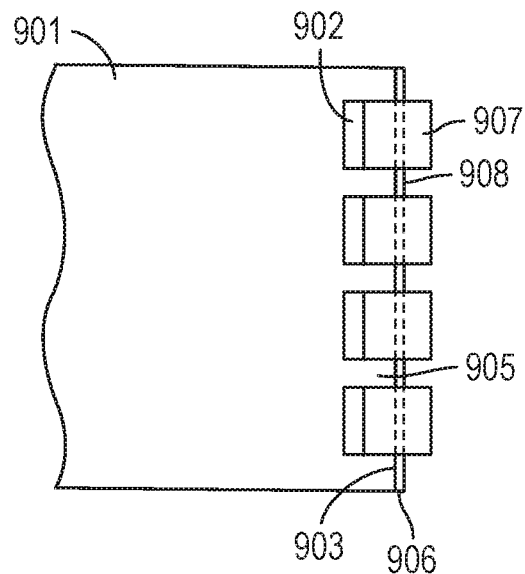
Figure 9B:
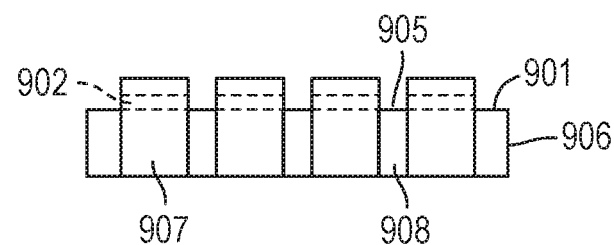

FIGS. 9A and 9B show top and side views, respectively, of a solar cell having four busbar segments 902 disposed on a surface 901 of a solar cell in proximity to peripheral side surface 903. The multiple busbars 902 are disposed on a first portion of surface 901 and are separated by a second portion of surface 905. An insulating layer 906 overlies peripheral side surface 903. Electrically conductive adhesive 907 overlies a first portion of insulating layer 906 and adjacent first portions of insulating layer 906 and are separated by a second portion 908 of insulating layer 906 that does not contain an overlying electrically conductive adhesive. The first portions of the insulating layer are commensurate with respective busbar segments. Electrically conductive adhesive 907 overlies each of the multiple busbar segments 902. The first portion of surface 901 comprising busbar segments 902 are commensurate with first portions of insulating layer 906 with overlying electrically conductive adhesive 907. Second portions 905 of surface 901 without a busbar segment and second portions 908 of insulating layer 906 without an overlying electrically conductive adhesive 907 isolate adjacent electrically conductive interconnects.

Figure 9C:
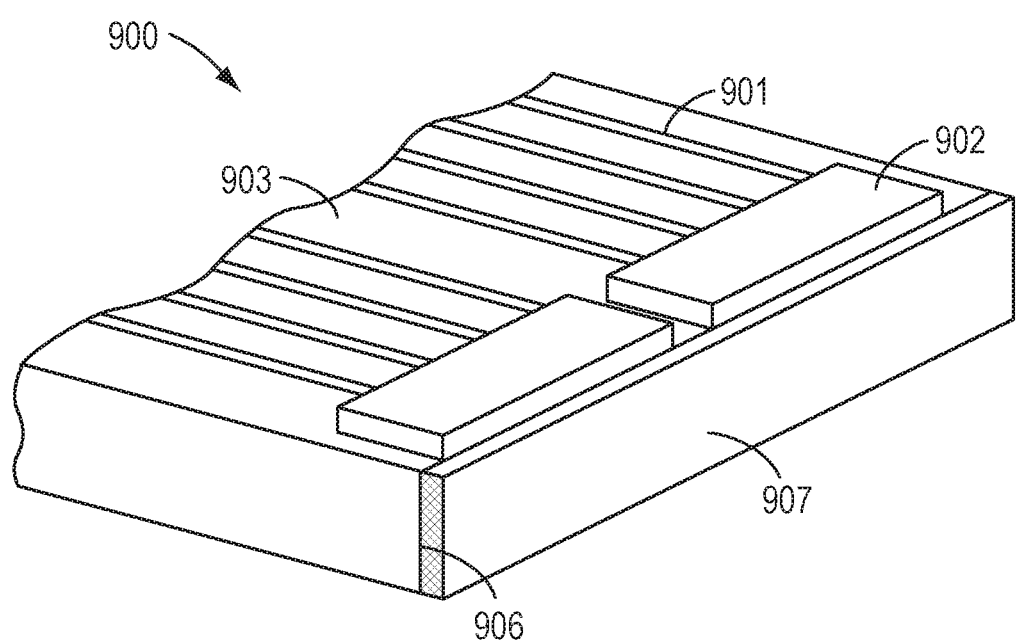

FIG. 9C shows a perspective view of the solar cells shown in FIGS. 9A and 9B.

FIG. 9D show a perspective view of a peripheral side surface of a solar cell 900 having gridlines 901 interconnected to busbar segments 902 disposed on frontside surface 903. Busbar segments 902 are at the edge of peripheral side surface 906 and an insulating layer 907 covers the peripheral side surface 906.

FIG. 9E shows a perspective view of the peripheral side surface of a solar cell as shown in FIG. 9D further comprising an electrically conductive adhesive overlying portions of the insulating layer 907 commensurate with busbar segments 902 and independently overlying each of the busbar segments 902.

A busbar can have, for example, a width from 0.1 mm to 1.3 mm, such as from 0.5 mm to 1 mm, or can be substantially the length of the solar cell.

Adjacent busbar segment can be separated by a distance, for example, from 10 µm to 3,000 µm, such as from 100 µm to 2,500 µm, or from 500 µm to 2,000 µm.

A frontside surface of a small area solar cell can include a busbar and, in some cases, the frontside surface does not include a busbar. Small areas solar cells can be cut from a large area solar cell such that the gridlines extend to peripheral edges of the small area solar cell. In these embodiments, the electrically conductive adhesive overlies the peripheral side surface of the solar cell and overlies all of the gridlines or can overlie groups of gridlines.

Solar cell interconnects provided by the present disclosure can comprise one or more elastomeric elements disposed on the insulating layer. An elastomeric element can be included to reduce shear stress on the solar cell interconnect and thereby reduce plastic deformation and increase the tensile strength of the electrically conductive adhesive interconnect. A photovoltaic module can be subjected to shear forces during assembly and/or during use resulting from differential thermal expansion coefficients of the various materials forming a photovoltaic module including the solar cell interconnects provided by the present disclosure.

FIGS. 10A-10C show an example of a solar cell interconnect comprising elastomeric elements.

FIGS. 10A and 10B show top and side views, respectively, of a solar cell peripheral side surface interconnect comprising elastomeric elements provided by the present disclosure.

FIGS. 10A and 10B show solar cell surface 1001, busbar segments 1002 disposed on surface 1001 in proximity to peripheral side surface 1003. Insulating layer 1004 overlies the peripheral side surface 1003. Electrically conductive adhesive 1007 overlies a portion of the insulating layer 1004 and overlies each of the busbar segments 1002. An elastomeric element 1010 overlies each second portion of the insulating layer 1004 including the portions between side edges 1005 and 1006. An elastomeric element 1010 can overlie each of the second portions of insulating layer 1004, some of the second portions, only the second portions between the side edges 1005/1006, or only between the nearest electrically conductive adhesive overlying the first portions of insulating layer 1004.

An elastomeric element can have a thickness that is approximately the same as the thickness of the electrically conductive adhesive or less than the thickness of the electrically conductive adhesive.

An elastomeric element can have a thermal expansion coefficient that is $2 \times 10^{-4}$ m/m° C.

An elastomeric element can comprise a thermoplastic elastomer or a thermoset elastomer.

Examples of suitable thermoplastic elastomers include, for example, polyamide and ethylene-vinyl acetate.

Examples of suitable thermoset elastomers include silicone rubber.

A suitable elastomer can be formulated to have a thermal expansion coefficient, for example, from $5 \times 10^{-5}$ m/m° C. to $4 \times 10^{-4}$ m/m° C.

A suitable elastomer can have glass transition temperature, for example, less than −40° C., less than −20° C., or less than −15° C.

A suitable elastomer can have modulus, for example, from 0.5 MPa to 55 MPa.

A suitable elastomer can have a melt temperature greater, for example, than 100° C., greater than 200° C., or greater than 300° C.

A suitable elastomer can have a tensile strength, for example, from 1 MPa to 60 MPa A suitable elastomer can have a % elongation, for example, from 100% to 4,500%, such as from 250% to 4,000%, or from 500% to 2,000%.

A suitable elastomer can comprise filler such as, for example, inorganic and/or organic filler, thermal stabilizers, UV stabilizers, antioxidants, leveling agents, and combinations of any of the foregoing.

An elastomeric element can comprise a cellular foam.

Elastomeric elements can be applied onto the second portions of the peripheral side surface either before or after the electrically conductive adhesive is applied. The elastomeric elements can be deposited using additive manufacturing such as by three-dimensional printing and/or by inkjet printing.

Photovoltaic modules provided by the present disclosure can be formed by curing an electrically conductive adhesive deposited between opposing peripheral side surfaces of adjacent solar cells to interconnect the adjacent solar cells.

A photovoltaic module can be formed by bringing an electrically conductive adhesive on a peripheral side surface of a first solar cell into contact with an electrically conductive adhesive on a peripheral side surface of a second solar cell. The electrically conductive adhesives can be brought together with slight pressure. When joined, the electrically conductive adhesives can be merged with a back and forth motion and/or ultrasonic energy can be applied to the joined electrically conductive adhesive to facilitate the ability of the two electrically conductive adhesives to merge.

The electrically conductive adhesives on the two solar cells can be brought into contact before the electrically conductive adhesives while the electrically conductive adhesives are wet, such as before the electrically conductive adhesives are dried and cured or before a partially dried film forms on the surface of the electrically conductive adhesives.

After the electrically conductive adhesives on the peripheral side surfaces of the two solar cells has been brought into contact, the electrically conductive adhesive can be dried, for example, by exposing the electrically conductive adhesive to a temperature, for example, from 125° C. to 175° C. for a duration, for example, from 2 minutes to 20 minutes, such as from 145° C. to 155° C. for a duration, for example, from 5 minutes to 10 minutes. A suitable time and temperature can be determined by the electrically conductive adhesive formulation and the conditions necessary to drive off solvent and low molecular weight species from the electrically conductive adhesive.

After the electrically conductive adhesive has been dried, the electrically conductive adhesive can be cured, for example, by exposing the electrically conductive adhesive to a temperature from 150° C. to 250° C. or from 20 minutes to 60 minutes, such as from 175° C. to 225° C. for from 30 minutes to 50 minutes. The temperature and duration of the curing exposure can depend on the electrically conductive adhesive formulation and on the curing chemistry.

An electrically conductive adhesive can comprise a free radical curing chemistry. The free radicals can be generated, for example, by exposing an ECA comprising a free radical photoinitiator to actinic radiation such as ultraviolet radiation or the electrically conductive adhesive can comprise chemical or thermal free radical initiators.

Figure 11:
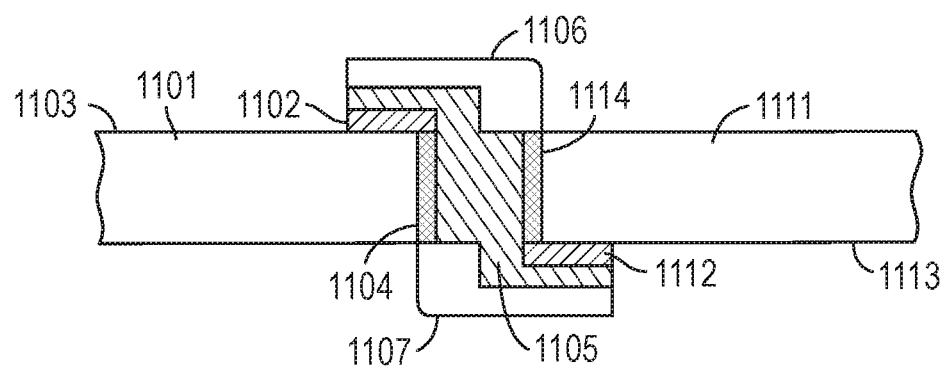
FIG. 11 shows a cross-sectional view of two solar cells interconnected by a side surface interconnect provided by the present disclosure and including a mechanical support element.

To provide additional mechanical support for a peripheral side surface solar cell interconnect provided by the present disclosure, an external elastomeric element can be disposed on the frontside and/or backside surfaces of a peripheral side surface interconnect. An example is shown in FIG. 11. FIG. 11 shows a first solar cell 1101 having a frontside busbar 1102 on frontside surface 1103 and a second solar cell 1111 having a backside busbar 1112 on backside surface 1113. Electrically conductive adhesive 1105 interconnects the frontside busbar 1102 and backside busbar 1112 and is insulated from the substrates by peripheral side surface insulators 1104/1114. A frontside elastomeric element 1106 is disposed on the frontside surface of the electrically conductive adhesive 1105 and a backside elastomeric element 1107 is disposed over the backside surface of the electrically conductive adhesive 1105. The frontside and backside elastomeric elements 1106/1107 can extend the width of the peripheral side surface interconnect, a portion of the peripheral side surface interconnect, or portions of the peripheral side surface interconnect.

The external elastomers can improve the mechanical integrity of the peripheral side surface interconnect and can improve the environmental reliability of the peripheral side surface interconnect by sealing and/or shielding the underlying electrically conductive adhesive from environmental conditions such as water, moisture, abrasion, corrosive materials, gases, and/or radiation including visible, infrared and ultraviolet radiation.

Photovoltaic modules can be fabricated by interconnecting a first ECA of a first solar cell to a second ECA on a second solar cell through an interconnection element.

An interconnection element can be applied to a surface of an ECA interconnect before the two solar cells are interconnected, during the process of bringing the two solar cells into close proximity, or after the two solar cells are brought into close proximity.

Figure 12A:
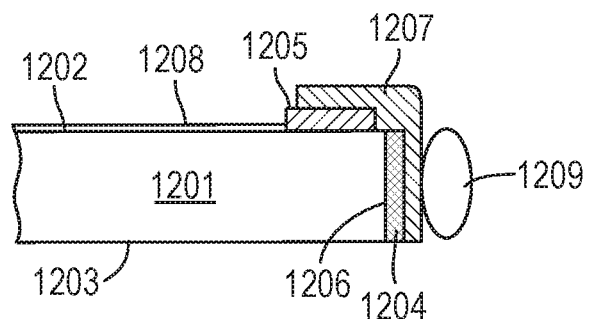
FIG. 12A shows a side view of a portion of a solar cell comprising a peripheral side surface interconnect with an interconnection element bonded to an electrically conductive adhesive.

A solar cell interconnect provided by the present disclosure can have the structure shown in FIG. 12A. As shown in FIG. 12A, a solar cell 12 can include a substrate 1201, a frontside surface 1202, a backside surface 1203, a busbar 1205 and gridlines 1208 disposed on the front side surface 1202, an insulating layer 1204 overlying peripheral side surface 1206, an ECA 1207 overlying at least a portion of insulating layer 1204 and a busbar 1205, and an interconnection element 1209 overlying and interconnected to the ECA. The interconnection element can be mechanically and electrically bonded to the ECA. For example, the interconnection element can be held in place by the cured ECA.

Figure 12B:
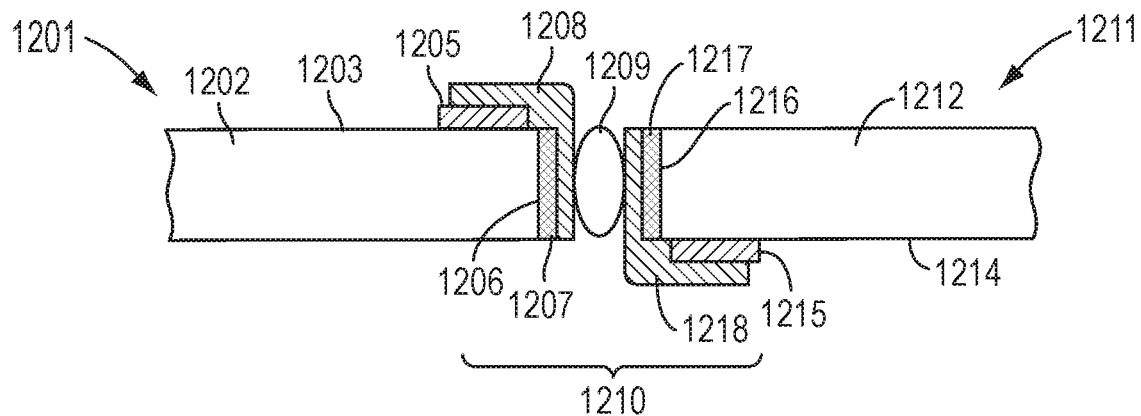
FIG. 12B shows a side view of a portion of a photovoltaic module comprising two solar cells interconnected by a peripheral side surface interconnect comprising an interconnection element between two electrically conductive adhesive layers.

A cross-sectional view of a photovoltaic module interconnected using a peripheral side surface interconnect having an interconnection element is shown in FIG. 12B. As shown in FIG. 12B, a first solar cell 1201 is interconnected to a second solar cell 1211 through peripheral side surface interconnect 1210. Solar cell 1201 includes a substrate 1202, a frontside busbar 1205 on the frontside surface 1203 and the busbar 1205 is situated in proximity to peripheral side surface 1206. An insulating layer 1207 is disposed on at least a portion of the peripheral side surface 1206 of the first solar cell 1201. ECA 1208 overlies at least a portion of the insulating layer 1207 and the frontside busbar 1205. The second solar cell 1211 includes a substrate 1212, a backside busbar 1215 on the backside surface 1214 and is situated in proximity to peripheral side surface 1216. An insulating layer 1217 is disposed on at least a portion of the peripheral side surface 1216 of the second solar cell 1211. ECA 1218 overlies at least a portion of insulating layer 1216 and backside busbar 1215. Peripheral side surface interconnect 1210 includes an electrically conductive adhesive 1208 disposed on at least a portion of the frontside busbar 1205 and overlying at least a portion of the first insulating layer 1207; electrically conductive adhesive 1218 disposed on at least a portion of the backside busbar 1215 and overlying at least a portion of insulating layer 1217; and an interconnection element 1209. Interconnect 1210 electrically interconnects frontside busbar 1205 on the first solar cell 1201 to backside busbar 1215 on the second solar cell 1211.

As shown in FIG. 12B, an interconnection element 1209 electrically interconnects the electrically conductive adhesive 1208 on the first solar cell 1201 to the electrically conductive adhesive 1218 on the second solar cell 1211.

The interconnection element 1209 can be weldable such that the interconnection element 1209 provides sufficient mechanical integrity and has a low electrical resistance. It can be desirable that the interconnection element maintain the structural integrity of the photovoltaic module when exposed to thermal stress under typical use conditions.

An interconnection element can comprise, for example, a solder paste or a solder-coated ribbon. An interconnection element can comprise, for example, an electrically conductive elastomer or an electrically conductive elastomeric element.

Frontside and backside gridlines (not shown) can be disposed on the frontside and backside surface of the first and second solar cells 1201/1211. The surface electrodes of a solar cell such as the frontside and backside gridlines can be made of any suitable electrically conductive material. The surface electrodes can be formed by printing such as by screen printing or ink-jet printing, conductive paste over the solar cell surfaces. Examples of suitable paste materials include silver paste, copper paste, glass pastes containing silver, gold paste, carbon paste, nickel paste, aluminum paste, transparent conductive oxide (TCO), such as indium tin oxide (ITO), and aluminum zinc oxide (AZO).

The gridlines and busbars of the solar cells may be in any suitable pattern, shape and dimension.

For example, in a wafer-based photovoltaic module, each solar cell may comprise frontside gridlines and backside gridlines, wherein frontside gridlines can comprise a plurality of parallel conductive lines and two or more conductive frontside busbars perpendicular to and interconnected to the conductive frontside gridlines, and wherein the backside gridlines can comprise a layer of conductive paste and two or more conductive backside busbar segments. The conductive frontside gridlines and the conductive frontside busbar segments can be formed, for example, of silver and the backside gridlines can be formed of silver gridlines or in case of a conventional Al-BSF solar cell a full-backside aluminum conductor paste is printed in intimate contact with the backside silver busbar paste. Frontside gridlines, backside gridlines, and busbars are typically fabricated from silver-containing metallization pastes. The type of metallization paste depends on the type of doped region being interconnected.

In general, for silicon solar cell metallization applications, thick-film pastes are used to form the frontside gridlines, frontside busbars, backside gridlines, and backside busbars. Thick-film pastes can include a suspension of conductive metal, glass frit, organic vehicles, and modifiers. Silver is the most common conductive filler used for frontside paste. Glass frit is used to bind the functional/conductive phase to a silicon wafer after thermal treatment. The glass frit also etches through anti-reflective and passivation layers to provide ohmic contact between the silver grid and the silicon surface of the solar cell. The organic vehicle can be an organic system that acts as a rheological carrier to control flow and printability of the paste. The organic vehicle can comprise resins, solvents, and additives. The attributes of the metallization paste, in particular the frontside silver paste, is important for achieving high efficiency solar cells. Therefore, the quality and performance of the silver metallization paste affects the economics of solar power systems. The screen-printing technology that is currently used for the majority of solar cells is being further developed for printing fine-line conductive grids to reduce silver consumption and thereby reduce cost, reduce shading and thereby increase the current density, and improve photovoltaic module performance.

An interconnection element can comprise a solder-coated ribbon. A solder-coated ribbon can have a thickness and width, for example, that is less than the thickness of a solar cell being interconnected. The edge of a solder-coated ribbon facing the incident solar radiation can have a substantially flat surface or can have a cross-sectional profile that enhances the ability of incident solar radiation to impinge upon the active regions of the solar cell. For example, the front and back edges of the solder-coated ribbon can have a convex shape or can have be textured.

A solder-coated ribbon can comprise a ribbon of an electrically conductive material such as Cu or Ag, with an exterior coating of a solder or solder alloy. A ribbon can have any suitable cross-sectional shape such as rectangular, circular, or oval. The exterior surface of the ribbon facing incident solar radiation can be configured to facilitate scattering of incident solar radiation onto active areas of the solar cell. For example, the exterior surface of a ribbon can be convex and/or textured.

A solder coating can have a thickness, for example, from 0.5 µm to 70 µm, such as from 10 µm to 50 µm.

The ribbon can be in the form of a thin sheet such as a foil.

Any suitable solder can be used. For example, a solder can comprise from 30 wt % to 100 wt % tin, and one or more of lead, silver, bismuth, zinc, copper, or a combination of any of the foregoing, independently in an amount from 0 wt % to 50 wt % such as from 1 wt % to 40 wt %, where wt % is based on the total weight of the solder alloy.

Solar cell edge interconnects provided by the present disclosure can be used with any suitable solar cell.

Solar cells comprising a peripheral side surface interconnect provided by the present disclosure comprise a surface and an edge, a busbar in proximity to the edge, a dielectric layer overlying the edge, and an electrically conductive adhesive overlying at least a portion of the dielectric layer and overlying at least a portion of the busbar.

A solar cell can comprise a wafer-based solar cell such as a c-Si or an mc-Si solar cell; a thin-film solar cell such as an a-Si, µc-Si, CdTe, copper indium selenide (CIS), or copper-indium-gallium selenide (CIGS) solar cells, light absorbing dyes, or organic semiconductor-based solar cells A busbar can be disposed in proximity to a peripheral edge of the solar cell or, for example, within less than 25 µm, less than 50 µm, less than 100 µm, or less than 200 µm from a peripheral edge of a solar cell. A busbar can be located near or at a peripheral edge of the solar cell to maximize the active area of the solar cell. A busbar can comprise any suitable material such as a conductive Ag thick-film. A busbar can be interconnected to a plurality of grid lines.

A peripheral side surface a solar cell can comprise an insulating layer such as a dielectric layer. An insulating layer can comprise a dielectric material such as, for example, $SiO_2$, $Si_3N_4$, or $Al_2O_3$. A purpose of the insulating layer is to electrically insulate a peripheral side surface of the solar cell from the electrically conductive adhesive forming the side surface interconnect.

Methods provided by the present disclosure include methods of fabricating a solar cell side surface interconnect and methods of interconnecting solar cells using a side surface interconnect to provide photovoltaic modules.

Methods of fabricating a solar cell side surface interconnect provided by the present disclosure can comprise depositing an insulating layer such as a dielectric layer overlying a peripheral side surface of a solar cell and depositing an electrically conductive adhesive overlying at least a portion of the insulating layer and overlying at least a portion of the busbar to provide a solar cell side surface interconnect.

Small-area solar cells such as solar cells having areas, for example, from about 500 $mm^2$ to 10,000 $mm^2$ such as from about 2,000 $mm^2$ to 8,000 $mm^2$, can be cut from larger area solar cells by laser grooving followed by mechanical separation. For example, a large-area solar cell can be separated into stripes having a width, for example, from about 15 mm to about 60 mm, and a length, for example, from 100 mm to 200 mm.

The large area solar cells include busbars and gridlines. After laser cutting the large area solar cells into small area solar cells, the small area solar cells can have busbars and gridlines or can only have only gridlines.

An insulating layer such as a dielectric layer can be deposited on a peripheral side surface of a solar cell using any suitable semiconductor deposition method such as, for example, chemical vapor deposition, molecular beam epitaxy, physical vapor deposition, or remote plasma enhanced chemical vapor deposition.

To deposit the insulating layer on an edge of solar cell, multiple solar cells can be stacked, and an insulating layer deposited on exposed peripheral side surfaces of the stacked solar cells. In this way, an insulating layer can be simultaneously applied to multiple solar cells. An insulating layer can be applied to a first peripheral surface and to a second peripheral surface of a solar cell, where the second peripheral surface is opposite the first peripheral surface. An insulating layer can be applied to peripheral solar cell surfaces that will be in proximity to the busbars. An insulating layer can be deposited to cover the edge of each of the solar cells in the stack. A dielectric layer can be applied to all four edges of a solar cell. An insulating layer can be applied to one or more peripheral side surfaces of a small area solar cell.

Figure 19:
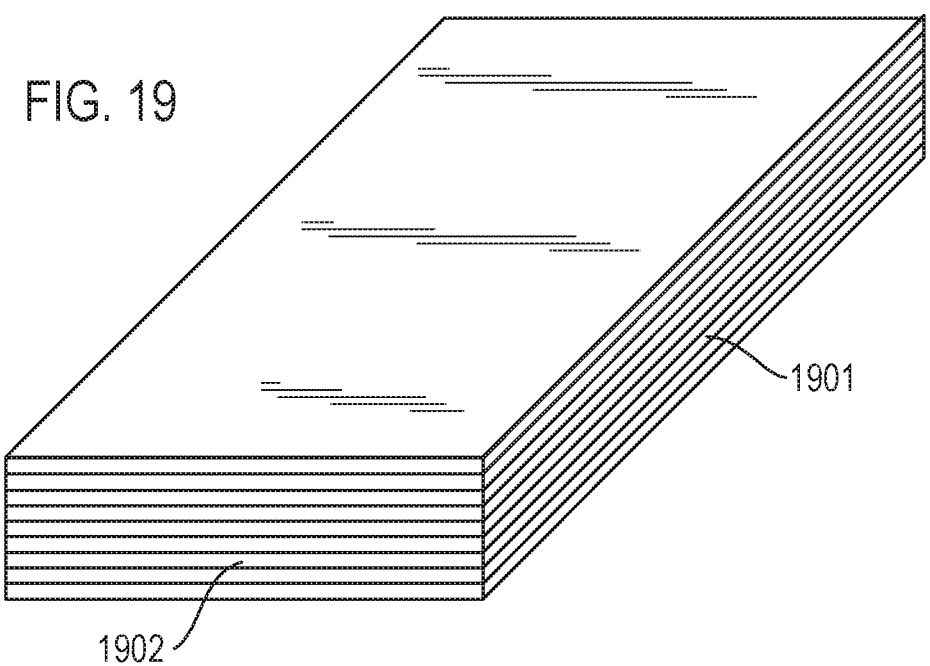
FIG. 19 shows an example of a stack of solar cells used in depositing an insulating layer such as a dielectric layer on the peripheral side surfaces of the solar cells.

FIG. 19 shows a stack of solar cells including peripheral side surfaces 1901 and 1902.

After depositing an insulating layer on opposing peripheral side surfaces of a large area solar cell, individual large area solar cells can be separated from the stack and cut into small area solar cells. An electrically conductive adhesive can then be applied to the peripheral side surfaces containing an insulating layer and to the busbars and/or gridlines of the small area solar cell. For example, an electrically conductive adhesive (ECA) can be applied to a first peripheral side edge and corresponding frontside busbar and/or to a second peripheral side edge and corresponding backside busbar of the solar cell using any suitable ECA materials and application methods.

Figure 13:
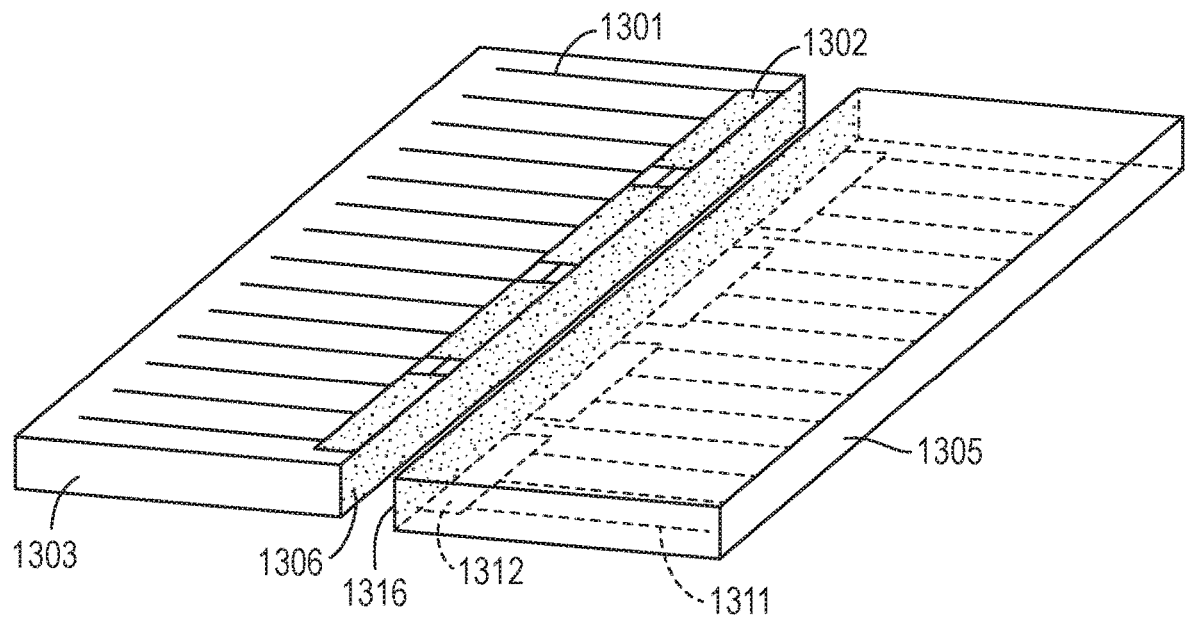
FIG. 13 shows a perspective view of two solar cells, with a first solar cell having a frontside busbar and frontside gridlines, and a second solar cell having a backside busbar and backside gridlines.

FIG. 13 shows a configuration of busbars and gridlines on two solar cells. Gridlines 1301 are interconnected to respective busbar segments 1302 on the frontside of a first solar cell 1303, and gridlines 1311 are interconnected to busbar segments 1312 of the backside of a second solar cell 1305. The peripheral side surfaces of both solar cells are coated with an insulating layer such as a dielectric layer 1306/1316.

After the busbars and gridlines are formed, an electrically conductive adhesive can be applied to the surface of the insulating layer or to a portion of the surface of the insulating layer and to the surface of a busbar or to a portion of the surface of a busbar. When cured, the electrically conductive adhesive is electrically interconnected to the busbar and is electrically insulated from the peripheral side surface of the solar cell by the insulating layer.

The electrically conductive adhesive can be applied to an insulated peripheral side surface of a solar cell using, for example, additive manufacturing such as by pulsed three-dimensional printing or by extrusion three-dimensional printing. The electrically conductive adhesive can be applied to the insulated peripheral side surface of a solar cell using, for example, transfer printing. An electrically conductive adhesive can cover the insulating layer or can be patterned to cover selected portions of the insulating layer. The electrically conductive adhesive can be applied to cover the insulating layer, to cover a portion of the insulating layer, to contact the entire length of a busbar, to contact a portion of the length of the busbar, or a combination of any of the foregoing.

After the electrically conductive adhesive is applied to the insulated peripheral side surface of the solar cell, the electrically conductive adhesive can be cured at a temperature, for example, from 150° C. to 250° C., for a duration, for example, from 20 minutes to 60 minutes. The heat can be applied, for example, by passing the solar cell through a belt oven. Before, curing, the electrically conductive adhesive can be dried, for example, by exposing the electrically conductive adhesive to a temperature, for example from 100° C. to 200° C. for a duration, for example, from 5 minutes to 20 minutes.

Figure 14:
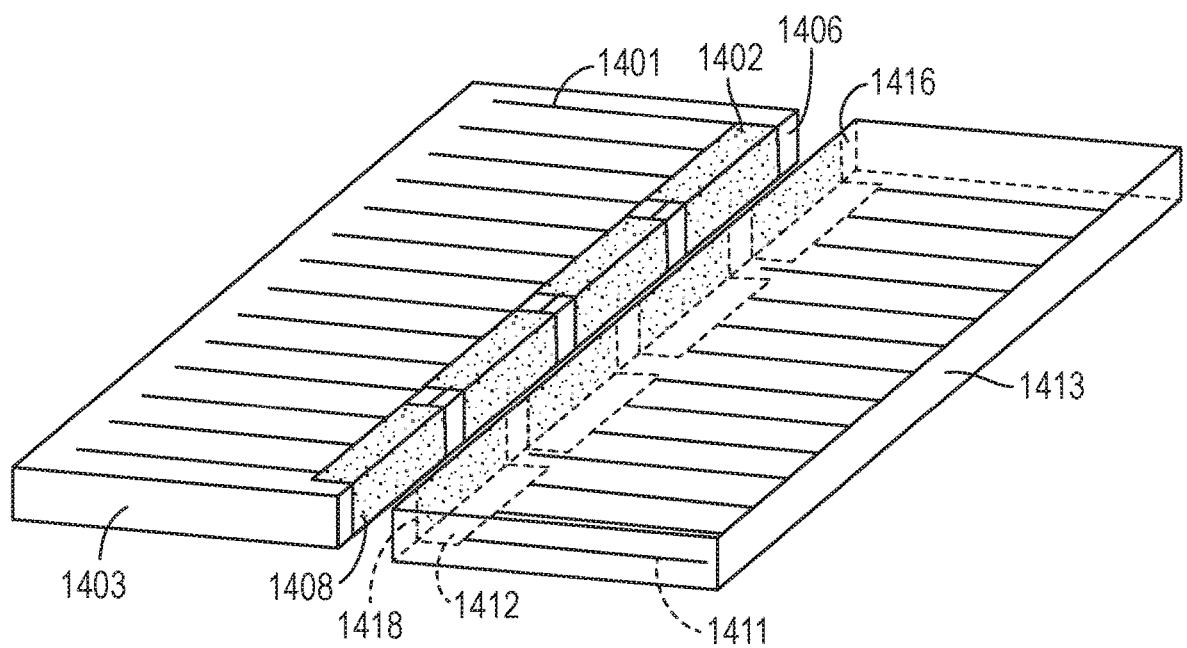
FIG. 14 shows the solar cells shown in FIG. 13 with an electrically conductive adhesive deposited on at least a portion of the busbar and at least a portion of the peripheral side surface of each of the two solar cells.

FIG. 14 shows two solar cells having an electrically conductive adhesive applied to the busbars and to opposing peripheral side surfaces of the respective solar cells. FIG. 14 shows gridlines 1401 interconnected to busbar segments 1402 on the frontside of the first solar cell 1403, and gridlines 1411 interconnected to busbar segments 1412 on the backside of the second solar cell 1413. An electrically conductive adhesive 1408/1418 covers the busbar segments 1402/1412 and extends over the edges of the solar cells to partially cover the insulating layer 1406/1416. Each of the solar cells shown in FIG. 14 includes four busbars. As shown in FIG. 14, the electrically conductive adhesive is patterned to cover the portion of the insulating layer in proximity to and commensurate with a respective busbar segment. In certain embodiments, the ECA can extend the length of the peripheral side surfaces and/or cover the peripheral side surfaces of the solar cell.

After peripheral side surface interconnects are formed on the positive and/or negative busbars of a solar cell, the solar cell can be interconnected to another solar cell to form a photovoltaic module.

To form a photovoltaic module, peripheral side surface interconnects of two solar cells can be interconnected with an electrically conductive adhesive or with an electrically conductive adhesive and an interconnection element that has low resistivity and can provide mechanical support for the interconnect. The electrically conductive adhesive or the electrically conductive adhesive and the interconnection element, when cured, can maintain the structural integrity of the solar cell interconnect during use conditions.

Two or more solar cells can be interconnected by the peripheral side surface interconnects to form a photovoltaic module.

It is desirable that the interconnection element be thin so as to minimize the separation between adjacent solar cells in order to reduce the resistance of the interconnect and to increase the active area of the photovoltaic module per module area.

An interconnection element can have a width, for example, that is less than the thickness of the solar cells being interconnected. For example, an interconnection element can have a width less than 250 µm, less than 225 µm, 200 µm, less than 175 µm, less than 150 µm, less than 125 µm, less than 100 µm, or less than 75 µm. An interconnection element can have a thickness, for example, from 50 µm to 250 µm, from 75 µm to 225 µm, from 100 µm to 200 µm, or from 125 µm to 175 µm.

An interconnection element can have a thickness that is less than the thickness of the solar cells being interconnected. For example, an interconnection element can have a thickness less than 200 µm, less than 175 µm, less than 150 µm, less than 125 µm, less than 100 µm, or less than 75 µm. An interconnection element can have a thickness, for example, from 50 µm to 200 µm, from 75 µm to 175 µm, or from 100 µm to 150 µm.

Two solar cells can be interconnected by bringing two opposing solar cell peripheral side surface interconnects into proximity and interconnected using an interconnection element.

An interconnection element can comprise, for example, a solder paste or a solder-coated ribbon.

When a solder paste is used as the interconnection element, two edge interconnects can be brought into proximity and a solder paste can be applied within the gap separating the opposing edge interconnects. The solder paste can be applied, for example, using additive manufacturing such as using three-dimensional printing.

Alternatively, a solder paste can be applied to the electrically conductive adhesive on an edge of a solar cell and an edge interconnect of a second solar cell can be brought into contact with the electrically conductive adhesive and subsequently cured to interconnect the two solar cells. The edge of the second solar cell may or may not have an applied solder paste before joining the edges of the two solar cells.

After the solder paste is applied and the solar cell edges are positioned, the solder paste can be cured at a temperature, for example, from 150° C. to 400° C. such as from 200° C. to 240° C., to interconnect the solar cells.

When a solder-coated ribbon is used as the interconnection element, the two edge interconnects can be brought into close proximity, and the solder-coated ribbon can be placed within the gap between the two opposing edge interconnects. The solder-coated ribbon can be press-fit into the gap or otherwise inserted into the gap between the edge interconnects and the opposing peripheral side surface interconnects. If appropriate, the opposing peripheral side surface interconnects can be brought closer together to adjust the separation and/or pressure of the peripheral side surface interconnects on the interconnection element to facilitate the formation of an electrically and mechanically viable interconnect.

Certain portions of the gap between opposing peripheral side surface interconnects can comprise a component configured to enhance the mechanical strength of the solar cell interconnect. For example, the component need not be electrically conductive. The component can be thermally conductive and/or thermal dissipative. The component can be rigid, elastomeric, or a combination thereof. The component can be, for example, a thermoset, thermoplastic, metal, metal alloy, ceramic, or composite material. A component can be situated in between electrically conductive regions of the module interconnect.

A non-electrically conductive elastomeric component can be printed on the edge of the solar cell using, for example, three-dimensional printing, to form an alternating pattern between the conductive adhesive on the first and second solar cells and the elastomeric component, which can be facing each other on both adjacent solar cells. The elastomeric polymer can be cross-linked during the electrically conductive adhesive curing or can be subsequently printed and cross-linked during lamination of the photovoltaic module. Alternatively, an elastomeric polymer printed between the electrically conductive adhesive patterns on the edges of the solar cells may not be necessary if the electrically conductive adhesive such as ethylene vinyl acetate (EVA) front and back laminating layers of the photovoltaic module fill the gaps between the electrically conductive adhesive patterns on the edges of the adjacent solar cells. In this case, the EVA may provide the necessary flexible adhesive bond that relieves mechanical stresses between the solar cells.

After the interconnection element has been deposited or positioned between the opposing solar cell edge interconnects, the interconnect can be heated to cause an electrically conductive bond such as a solder to the electrically conductive adhesive to electrically interconnect two solar cells to form a photovoltaic module. The solder paste, or solder-coated ribbon can be bonded to the electrically conductive adhesive, for example, bypassing the module pre-assembly through a radiation lamp heated or resistance heated oven.

The process can be used to simultaneously and/or sequentially interconnect additional solar cells.

Figure 15A:
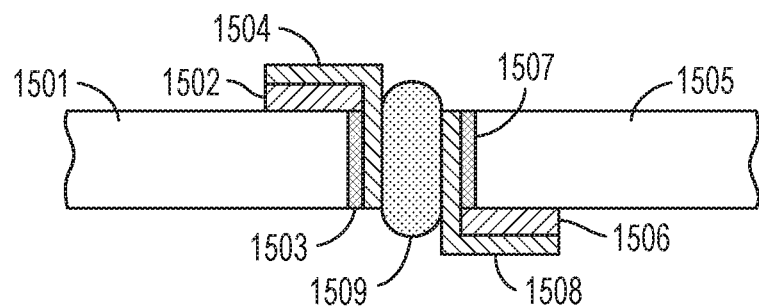
FIGS. 15A-15D show side views of examples of solar cells interconnected using side surface interconnects provided by the present disclosure. The adjacent solar cells can be interconnected using an interconnection element such as, for example, a solder paste (FIG. 15A), a solder-coated ribbon (FIG. 15B), a solder-coated ribbon having convex outer surface (FIG. 15C), or a solder-coated ribbon having textured outer surfaces (FIG. 15D).
Figure 15B:
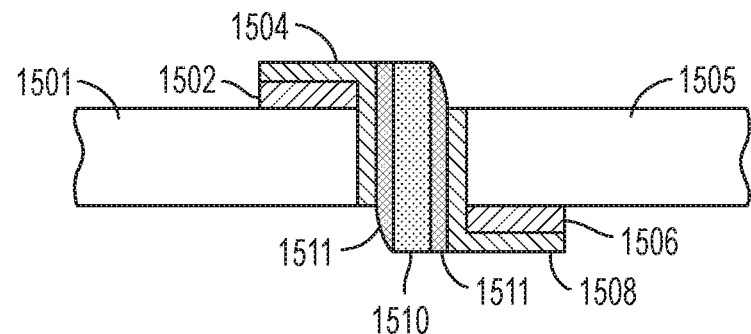
Figure 15C:
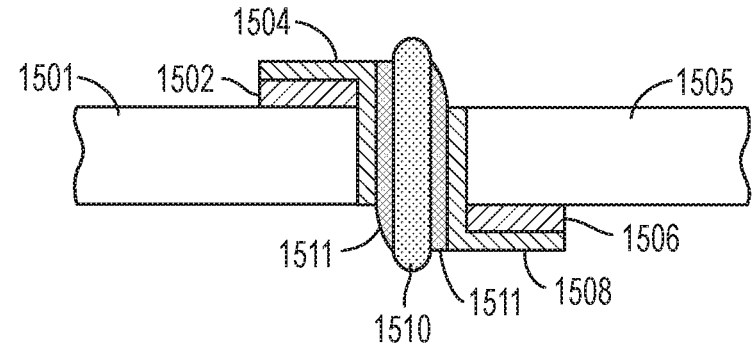
Figure 15D:
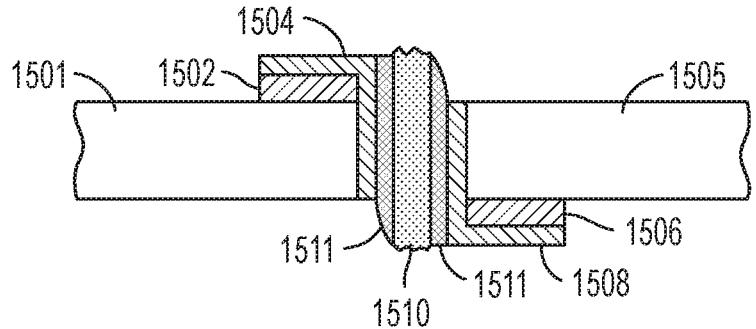

FIGS. 15A-15D show cross-sectional views of solar cells interconnected using peripheral side surface interconnects provided by the present disclosure. The cross-sectional views include a first solar cell 1501, a frontside busbar 1502, an insulating layer 1503, an electrically conductive adhesive 1504, a second solar cell 1505, a backside busbar 1506, an insulating layer 1507, an electrically conductive adhesive 1508, and an interconnection element 1509. In FIG. 15A the interconnection element is a solder paste, in FIG. 15B the interconnection element is a solder-coated ribbon including a core 1510 and solder 1511, in FIG. 15C the interconnection element is a solder-coated ribbon in which the upper surface is convex to enhance light scattering and light trapping in the photovoltaic module, and in FIG. 15D the interconnection element is a solder-coated ribbon in which the upper surface is textured to enhance light scattering and optical trapping in the photovoltaic module.

An interconnection element used to interconnect two solar cell side surfaces can comprise an elastomeric interconnection element. The elastomeric interconnection element can be configured to provide flexibility to the interconnect to accommodate mechanical stress generated at the interconnect during use conditions, such as generated by thermal stress. An elastomeric interconnection element can be an electrically conductive elastomer. The electrically conductive filler can be dispersed homogenously or in homogeneously within the elastomeric interconnection element. For example, the electrically conductive filler can be disposed on the outer surface of the elastomeric interconnection element.

The electrically conductive filler can be in any suitable form such as particles, flakes, filaments, and/or wires. The electrically conductive filler can comprise a suitable amount of a weldable material such as a solder alloy for bonding to the electrically conductive adhesive on the edges of the solar cell.

Any suitable elastomer or combination of elastomers can be used, which can be thermosets or thermoplastic elastomers.

An elastomeric interconnection element can have a core/shell configuration. For example, the interior of the interconnection element can be elastomeric, which is surrounded by a shell of an electrically conductive material. The electrically conductive material can be, for example, an electrically filled elastomer, or a thin electrically conductive foil such as a solder-coated foil.

Exterior surfaces of an elastomeric interconnection element can have exterior (top and bottom) surfaces comprising an environmentally inert material configured to enhance the weatherability of the elastomeric interconnection element. For example, the outer surfaces of the elastomeric interconnection element can comprise a weatherable polymer which covers a shell of an electrically conductive material.

An elastomeric interconnection element can be formed or applied by methods such as coextrusion and inserted between opposing solar cell edges during assembly. An elastomeric interconnection element can be formed in place using coextrusion methods.

An elastomeric interconnection element can further comprise thermally conductive filler. An elastomeric interconnection element can further comprise filler configured to enhance the mechanical robustness and stability of the interconnect, such as fiber including, for example, silica fiber, carbon fiber, metal fiber, and/or organic fiber.

Figure 16A:
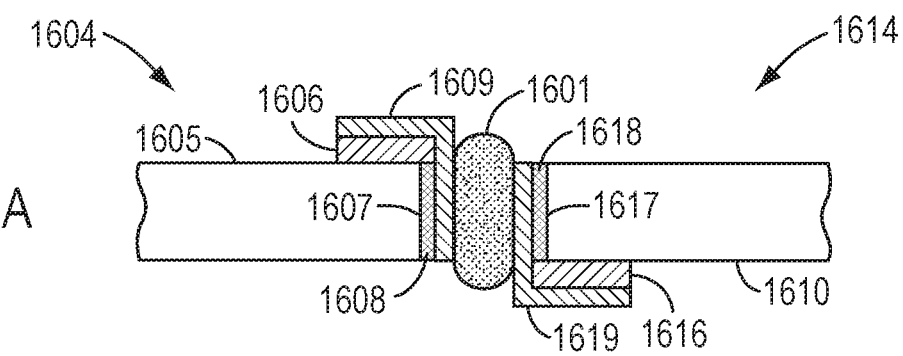
FIGS. 16A-16D show side views of solar cells interconnected using an electrically conductive elastomer (FIG. 16A) or an electrically conductive elastomeric element (FIGS. 16B-16D).
Figure 16B:
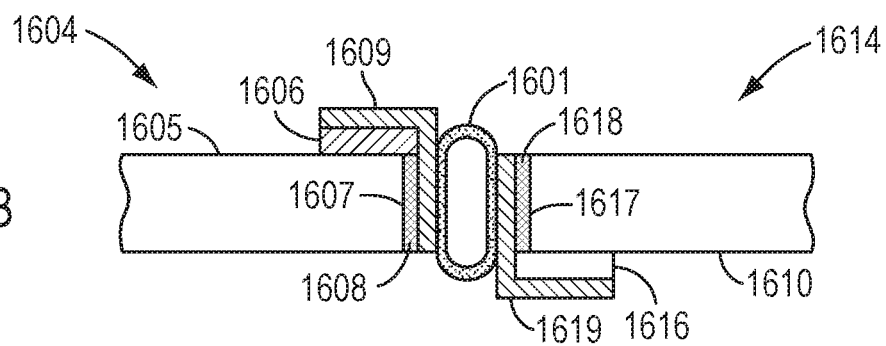
Figure 16C:
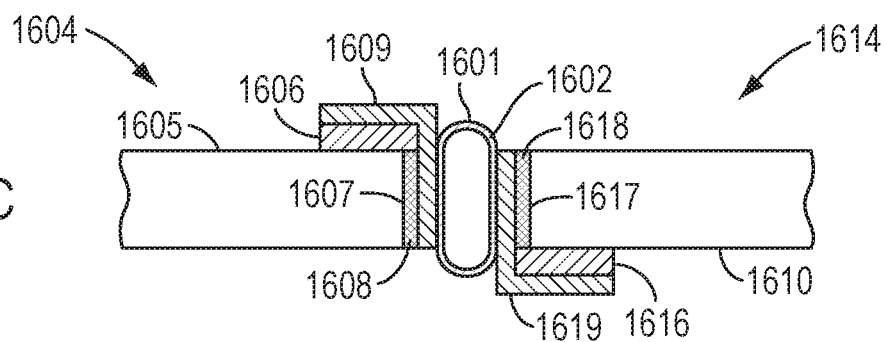
Figure 16D:
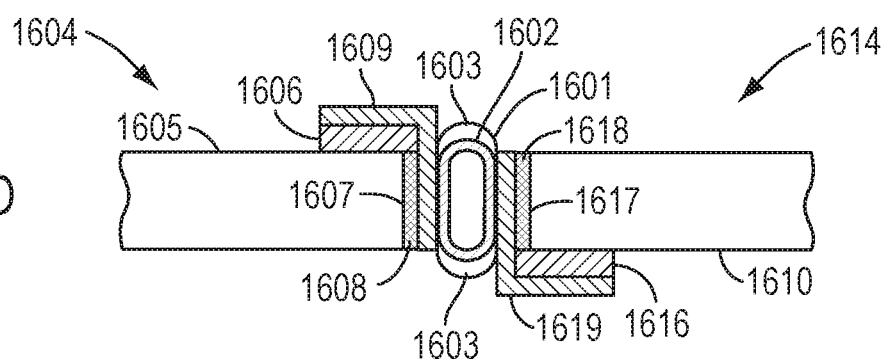

FIGS. 16A-16D show cross-sectional views of examples of solar cells interconnected using elastomeric interconnection elements 1601. FIGS. 16A-16D include first solar cell 1604 with busbar 1606 disposed on frontside surface 1605, insulating layer 1608 disposed on peripheral side surface 1607, and ECA 1609 overlying at least a portion of insulating layer 1608 and busbar 1606. FIGS. 16A-16D include second solar cell 1614 with busbar 1616 disposed on backside surface 1610, insulating layer 1618 disposed on peripheral side surface 1617, and ECA 1619 overlying at least a portion of insulating layer 1618 and busbar 1616. Interconnection element 1601 interconnects the two solar cells through respect ECA 1609/1619. FIG. 16A shows solar cells interconnected using an electrically conductive elastomer in which the electrically conductive filler is homogenously dispersed throughout the elastomeric interconnection element 1601. FIG. 16B shows solar cells interconnected using an electrically conductive elastomer in which the electrically conductive filler is disposed on the exterior surface of the elastomeric interconnection element. FIG. 16C shows an elastomeric interconnection element comprising an exterior electrically conductive thin-film 1602. FIG. 16D shows an elastomeric interconnection element 1601 comprising an electrically conductive film 1602 in which the exposed exterior surfaces of the element comprise a weatherable material 1603.

Solar cell interconnects provided by the present disclosure include tandem backside interconnects. Tandem backside interconnects do not have any busbars on the frontside surface of the solar cell and thereby increase the irradiation area. In a tandem backside interconnect, the frontside busbar overlies the backside surface of the solar cell, and the frontside gridlines and/or frontside busbar extend over the peripheral side surface and is interconnected to the frontside busbar overlying the backside surface.

Figure 17A:
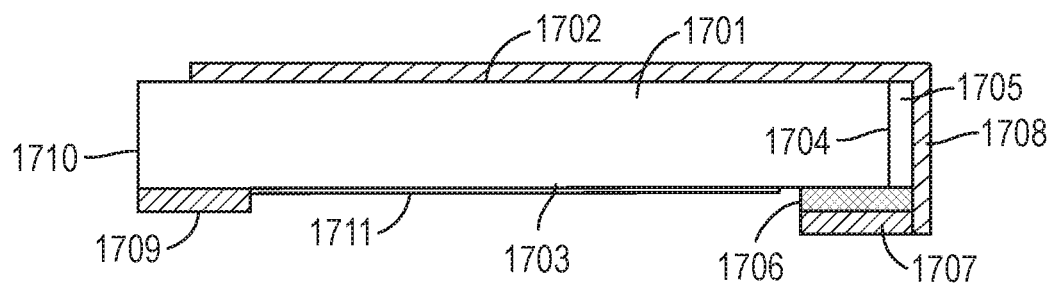
FIGS. 17A-17B show a cross-sectional view (FIG. 17A) and a side view (FIG. 17B) of a side surface interconnect in which the frontside gridlines extend over the side surface.

An example of a tandem backside solar cell interconnect is shown in FIG. 17A.

FIG. 17A shows solar cell 1700 including a substrate 1701, a frontside surface 1702, backside surface 1703, and peripheral side surface 1704. A side surface insulating layer 1705 overlies the peripheral side surface 1704. A frontside busbar 1707 is disposed on a frontside busbar insulating layer 1706 overlying the backside surface 1703 in proximity to the peripheral side surface 1704. Frontside gridlines 1708 overlie a portion of the frontside surface 1702, overlie a portion of the side surface insulating layer 1705 and are interconnected to frontside busbar 1707. A backside busbar 1709 is disposed on backside surface 1703 in proximity to second peripheral side surface 1710. Backside gridlines 1711 extend across a portion of backside surface 1703 and are interconnected to backside busbar 1709.

The backside insulating layer, which isolates the frontside busbar on the backside of the sub-cell from the backside doped region (base) of the solar cell can be a portion of the backside insulating dielectric surface used for protecting and passivating the backside of a solar cell such as a N-type PERT or P-type PERC solar cell. For Al-BSF solar cells with no backside insulating layer, a printed insulating layer can be applied to a portion of the backside surface solar cell in proximity to the edge of the solar cell that that does not have an aluminum conductor.

Figure 17B:
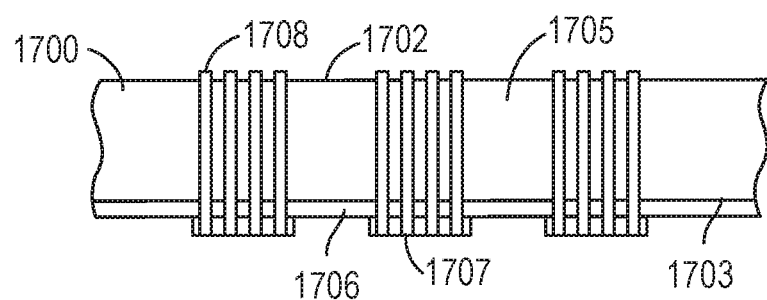

A side view of a tandem backside interconnect is shown in FIG. 17B.

The side view of a tandem backside interconnect shown in FIG. 17B includes frontside surface 1702 and backside surface 1703. Backside insulating layer 1706 overlies at least a portion of the backside surface 1703 in proximity to the peripheral side surface. A side surface insulating layer 1705 overlies the peripheral side surface. One or more frontside busbars 1707 overlie the backside insulating layer

1706. Frontside gridlines 1708 disposed on the frontside surface 1702 extend over side surface insulating layer 1705 and over at least a portion of a frontside busbar 1707.

Backside insulating layers can extend the length of the solar cell or can be disposed on portions of the backside surface in proximity to the side edge.

Materials used to form the gridlines, busbars, side surface insulating layers can be the same as described for the solar cells comprising the side-surface interconnects.

The frontside busbar insulating layer can comprise, for example, an insulator-type elastomeric resist, a printed dielectric that forms after curing, or a dielectric already present on the backside of the solar cell such as a P-type PERC or N-type PERT solar cell.

Photovoltaic modules can comprise two or more solar cells comprising a tandem backside interconnect provided by the present disclosure.

A photovoltaic module can be formed by positioning two solar cells comprising a tandem backside interconnect in a planar, side-by-side configuration and connecting the frontside busbar of a first solar cell to a backside busbar of a second solar cell using, for example, an electrically conductive element such as an electrically conductive ribbon, wire, or tab. The electrically conductive element can be, for example, soldered or welded to the busbars. The electrically conductive element can be flexible so as to accommodate shear stress during use.

In embodiments in which solar cells comprising a tandem backside interconnect comprise two or more frontside busbars and/or backside busbar segments, the two or more frontside busbar segments of a first solar cell can be independently connected to respective two or more backside busbar segments of a second solar cell using an electrically conductive element.

Figure 18:
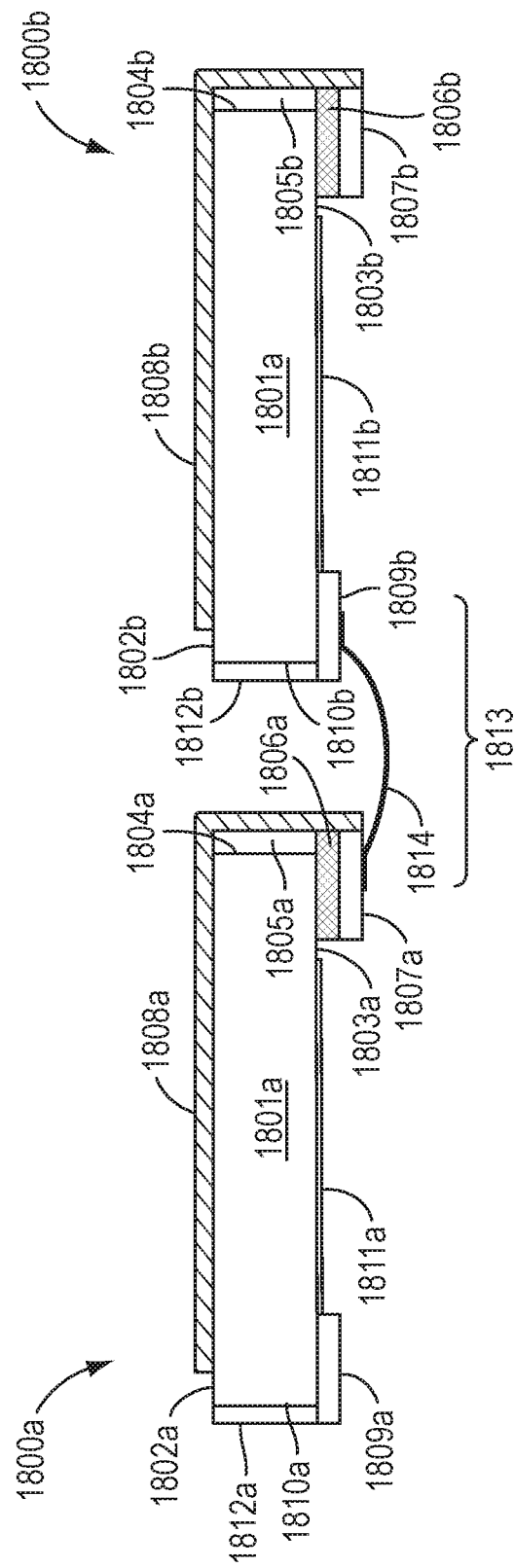
FIG. 18 shows a cross-sectional view of an example of two solar cells interconnected by backside interconnect provided by the present disclosure.

A side view of a photovoltaic module comprising two interconnected solar cells are shown in FIG. 18, FIG. 18 shows a first subcell 1800*a* and a second subcell 1800*b* including substrates 1801*a*/1801*b*, frontside surfaces 1802*a*/1802*b*, backside surfaces 1803*a*/1803*b*, first peripheral side surfaces 1804*a*/1804*b*, and peripheral side surface insulating layers 1805*a*/1805*b* overlying first peripheral side surfaces 1804*a*/1804*b*. Backside insulating layers 1806*a*/1806*b* overlie backside surfaces 1803*a*/1803*b* or portions of the backside surfaces 1803*a*/1803*b* and frontside busbar 1807*a*/1807*b* overly the one or more backside surface insulating layers 1806*a*/1806*b*. Frontside gridlines 1808*a*/1808*b* extend over peripheral side surface insulating layers 1805*a*/1805*b* and are interconnected to frontside busbar 1807*a*/1807*b*. Backside busbar 1809*a*/1809*b* are disposed on the backside surface 1803*a*/1803*b* in proximity to second peripheral side surface 1810*a*/1810*b*. Backside gridlines 1811*a*/1811*b* are electrically interconnected to the backside busbar 1809*a*/1809*b*. Side surface insulating layers 1812*a*/1812*b* overlie second peripheral side surfaces 1810*a*/1810*b*.

The one or more frontside busbar segments 1807*a* of the first subcell are interconnected to respective one or more backside busbars 1809*b* of the second subcell by one or more electrically conductive elements such as electrically conductive tabs 1814 to provide the tandem backside interconnect 1813.

In FIG. 18, the two solar cells are shown as being spaced apart with a gap between the conductors 1808*a* on the first solar cell and the insulating layer 1812*b* on the second solar cell. However, because the peripheral side surfaces of the solar cells are insulated, the opposing surfaces of the adjacent solar cells may be close together or in contact, for example, such that conductors 1808*a* contact insulating layer 1812*b*. In this way, the active surface area of a photovoltaic system can be maximized and the interconnection resistance between solar cells minimized, thereby increasing the overall fill factor and the efficiency of a photovoltaic system formed using small area solar cells interconnected using tandem backside interconnects provided by the present disclosure.

Solar cells comprising tandem backside interconnects provided by the present disclosure can be fabricated using solar cell and semiconductor manufacturing methods known in the art.

A side surface insulating layer can be applied to at least one peripheral side surface of a solar cell substrate. The side surface insulating layer can be applied using additive manufacturing, thin-film coating, or by gas phase deposition such as be MOCVD.

The one or more frontside busbar segments insulating layers on the backside can be a dielectric already pre-existing before cutting the original large-area solar cell into sub-cells that has been deposited by a CVD process or the insulating layer can be applied using screen printing.

Similarly, the electrically conductive element such as the frontside busbars, the backside busbars, the frontside busbars, and the backside busbars can be deposited by screen printing conductive pastes.

The frontside gridlines can be extended over the side surface insulating layer and interconnected to frontside busbars by screen printing or by additive manufacturing such as three-dimensional printing or inkjet printing.

For example, after the frontside gridlines and the frontside busbars are fabricated, or in embodiments where the frontside gridlines and/or busbars are present on the small area solar cells after they have been cut from a large area solar cell, extensions of the frontside gridlines can be deposited onto the side surface insulating layer by three-dimensional printing. The gridline extensions wrapping around a peripheral side surface to the backside comprise an electrically conductive adhesive material cured at low temperature, such as at a temperature from 150° C. to 250° C.

Alternatively, after the side surface insulating layer is deposited onto a side surface of the solar cell substrate, a copper conductor can be deposited onto the insulating layer to extend the gridlines.

Solar cells provided by the present disclosure can be incorporated into photovoltaic modules, and the photovoltaic modules can be incorporated into power generation systems. Thus, aspects of the invention include photovoltaic modules and power generation systems comprising solar cell edge interconnects provided by the present disclosure.

Photovoltaic modules interconnected using the edge interconnects provided by the present disclosure can maintain acceptable conductivity and adhesion strength following exposure to accelerated environmental test conditions including damp-heat testing and accelerated thermal cycling, which are used to qualify solar cells for a 25-year service life.

The use of solar cell edge interconnects provided by the present disclosure can facilitate the use of small-area solar cells. It is estimated that the output of a photovoltaic module interconnected using the disclosed methods will have approximately 2% improvement in absolute module efficiency compared to a photovoltaic module interconnected using traditional front-to-back ribbons and about 0.3% absolute module efficiency improvement over shingled solar cell designs for a bifacial photovoltaic module.

ASPECTS OF THE INVENTION

The invention is further defined by the following aspects.

Aspect 1

A solar cell, wherein the solar cell comprises: a surface and a peripheral side surface; a busbar, wherein the busbar is in proximity to the peripheral side surface; an insulating layer overlying the peripheral side surface; and an electrically conductive adhesive overlying at least a portion of the insulating layer and overlying at least a portion of the busbar.

Aspect 2

The solar cell of aspect 1, wherein the electrically conductive adhesive comprises Ag, Cu, or a combination thereof.

Aspect 3

The solar cell of any one of aspects 1 to 2, wherein the insulating layer comprises a dielectric layer comprising $SiO_2$, $Si_3N_4$, or $Al_2O_3$.

Aspect 4

The solar cell of any one of aspects 1 to 2, wherein the insulating layer comprises a copper diffusion barrier dielectric material.

Aspect 5

The solar cell of aspect 4, wherein the copper diffusion barrier dielectric material comprises titanium silicon nitride, silicon nitride, $ZrB_2$, $MnSi_xO_y$, or a combination of any of the foregoing.

Aspect 6

The solar cell of any one of aspects 1 to 5, wherein the insulating layer is configured to passivate the peripheral side surface of the solar cell.

Aspect 7

The solar cell of any one of aspects 1 to 6, wherein the solar cell comprises a silicon substrate.

Aspect 8

The solar cell of any one of aspects 1 to 7, further comprising a solder paste overlying at least a portion of the electrically conductive adhesive.

Aspect 9

The solar cell of aspect 8, wherein the solder paste comprises Sn; and Ag, Cu, Pb, Bi, or a combination of any of the foregoing.

Aspect 10

A photovoltaic module, comprising: a first solar cell of any one of aspects 1 to 9, wherein the first solar cell comprises a first electrically conductive adhesive; a second solar cell of any one of aspects 1 to 9, wherein the second solar cell comprises a second electrically conductive adhesive; and an interconnection element interconnecting the first electrically conductive adhesive and the second electrically conductive adhesive.

Aspect 11

The photovoltaic module of aspect 10, wherein the interconnection element comprises a solder paste.

Aspect 12

The photovoltaic module of aspect 11, wherein the solder paste comprises Sn; and Ag, Cu, Pb, Bi, or a combination of any of the foregoing.

Aspect 13

The solar cell module of any one of aspects 10 to 12, wherein the interconnection element comprises a solder-coated ribbon.

Aspect 14

The photovoltaic module of aspect 13, wherein the outer surfaces of the solder-coated ribbon are rounded, textured, or a combination thereof.

Aspect 15

The photovoltaic module of any one of aspects 13 to 14, wherein the solder-coated ribbon has a round cross-sectional profile or an oval cross-sectional profile.

Aspect 16

The photovoltaic module of any one of aspects 13 to 15, wherein the solder-coated ribbon comprises a solder-coated copper foil.

Aspect 17

The method of any one of aspects 10 to 16, wherein the interconnection element comprises an elastomeric interconnection element.

Aspect 18

The photovoltaic module of any one of aspects 13 to 17, wherein the solder-coated ribbon comprises a coating of Sn; and Ag, Cu, Pb, or a combination of any of the foregoing.

Aspect 19

The photovoltaic module of any one of aspects 10 to 18, wherein the interconnection element has a width less than 250 μm.

Aspect 20

The photovoltaic module of any one of aspects 10 to 18, wherein the interconnection element has a width from 50 μm to 250 μm.

Aspect 21

The photovoltaic module of any one of aspects 10 to 20, wherein the interconnection element has a thickness within ±10% the thickness of the solar cell.

Aspect 22

The photovoltaic module of any one of aspects 10 to 21, wherein the interconnection element has a thickness less than 200 μm.

Aspect 23

The photovoltaic module of any one of aspects 10 to 21, wherein the interconnection element has a thickness from 50 μm to 200 μm.

Aspect 24

The photovoltaic module of any one of aspects 10 to 23, wherein the first solar cell and the second solar cell are coplanar.

Aspect 25

The photovoltaic module of any one of aspects 10 to 24, wherein a busbar on the frontside of the first solar cell is electrically interconnected to a busbar on the backside of the second solar cell.

Aspect 26

A photovoltaic module comprising at least two solar cells of any one of aspects 1 to 9.

Aspect 27

A power system comprising a plurality of the photovoltaic modules of aspect 26.

Aspect 28

A method of fabricating a solar cell peripheral side surface interconnect, comprising: depositing an insulating layer overlying a peripheral side surface of a solar cell; depositing a busbar metallization in proximity to the peripheral side surface of the solar cell; and depositing an electrically conductive adhesive overlying at least a portion of the insulating layer and overlying at least a portion of the busbar to provide a solar cell peripheral side surface interconnect.

Aspect 29

The method of aspect 28, further comprising, after depositing the busbar metallization, curing the busbar metallization to form a busbar.

Aspect 30

The method of any one of aspects 28 to 29, further comprising, after depositing the electrically conductive adhesive, curing the electrically conductive adhesive.

Aspect 31

The method of aspect 30, further comprising, after curing the electrically conductive adhesive, depositing a solder paste overlying at least a portion of the cured electrically conductive adhesive.

Aspect 32

The method of aspect 31, wherein depositing the solder paste comprises additive manufacturing.

Aspect 33

The method of any one of aspects 28 to 32, further comprising, after depositing the insulating layer, depositing the busbar in proximity to the peripheral side surface of a solar cell.

Aspect 34

The method of aspect 32, wherein depositing the busbar comprises screen printing a metallization paste.

Aspect 35

The method of any one of aspects 28 to 34, wherein depositing the insulating layer comprises chemical vapor deposition.

Aspect 36

The method of any one of aspects 28 to 34, wherein depositing the electrically conductive adhesive comprises additive manufacturing.

Aspect 37

A solar cell comprising an interconnect fabricated using the method of any one of aspects 28 to 36.

Aspect 38

A photovoltaic module comprising at least two solar cells of aspect 37.

Aspect 39

A power system comprising a plurality of the photovoltaic modules of aspect 38.

Aspect 40

A method of interconnecting solar cells, comprising: contacting a first electrically conductive adhesive of a first solar cell of any one of aspects 1 to 9 and a second electrically conductive adhesive of a second solar cell of any one of aspects 1 to 9 with an interconnection element; and bonding the interconnection element to the first and second electrically conductive adhesives to electrically interconnect the first solar cell and the second solar cell.

Aspect 41

The method of aspect 40, wherein the interconnection element comprises a solder paste.

Aspect 42

The method of any one of aspects 40 to 41, wherein the interconnection element comprises a solder-coated ribbon.

Aspect 43

The method of aspect 42, wherein outer surfaces of the solder-coated ribbon are rounded, textured, or a combination thereof.

Aspect 44

The method of any one of aspects 42 to 43, wherein the solder-coated ribbon has a round cross-sectional profile or an oval cross-sectional profile.

Aspect 45

The method of any one of aspects 42 to 44, wherein the solder-coated ribbon comprises a solder-coated Cu foil.

Aspect 46

The method of any one of aspects 42 to 45, wherein the solder-coated ribbon comprises a coating of Sn; and Ag, Cu, Pb, Bi or a combination of any of the foregoing.

Aspect 47

The method of any one of aspects 40 to 46, wherein the interconnection element has a width less than 250 μm.

Aspect 48

The method of any one of aspects 40 to 46, wherein the interconnection element has a width from 50 μm to 250 μm.

Aspect 49

The method of any one of aspects 40 to 48, wherein the interconnection element has a thickness that is less than ±10% the thickness of the solar cell.

Aspect 50

The method of any one of aspects 40 to 49, wherein the interconnection element has a thickness less than 200 μm.

Aspect 51

The method of any one of aspects 40 to 49, wherein the interconnection element has a thickness from 50 μm to 200 μm.

Aspect 52

The method of any one of aspects 40 to 50, wherein the interconnection element comprises an elastomeric interconnection element.

Aspect 53

The method of aspect 52, wherein the elastomeric interconnection element comprises an electrically conductive elastomer.

Aspect 54

The method of any one of aspects 52 to 53, wherein at least a portion of the exterior surface of the elastomeric interconnection element is electrically conductive.

Aspect 55

The method of any one of aspects 52 to 54, wherein at least a portion of the interior of the elastomeric interconnection element is electrically conductive.

Aspect 56

The method of any one of aspects 40 to 55, wherein the method further comprises depositing the interconnection element between the first solar cell and the second solar cell.

Aspect 57

The method of aspect 56, wherein depositing the interconnection element comprises depositing using additive manufacturing.

Aspect 58

The method of any one of aspects 40 to 57, wherein contacting comprises: bringing the first electrically conductive adhesive in proximity to the second electrically conductive adhesive; and depositing an interconnection element to contact both the first electrically conductive adhesive in proximity to the second electrically conductive adhesive.

Aspect 59

The method of aspect of any one of 40 to 58, wherein the interconnection element comprises a solder paste.

Aspect 60

The method of any one of aspects 40 to 58, wherein the interconnection element comprises an electrically conductive elastomer.

Aspect 61

The method of any one of aspects 40 to 58, wherein the interconnection element comprises an electrically conductive elastomeric element.

Aspect 62

The method of any one of aspects 40 to 61, wherein the first solar cell further comprises a solder paste overlying at least a portion of the first electrically conductive adhesive; and contacting comprises bringing the solder paste into contact with the second electrically conductive adhesive.

Aspect 63

The method of any one of aspects 40 to 61, wherein, the first solar cell further comprises a first solder paste overlying at least a portion of the first electrically conductive adhesive; the second solar cell further comprises a second solder paste overlying at least a portion of the second electrically conductive adhesive; and contacting comprises contacting the first solder paste to the second solder paste.

Aspect 64

Solar cells interconnected using the method of any one of aspects 40 to 63.

Aspect 65

A photovoltaic module comprising the solar cells of aspect 64.

Aspect 66

A power system comprising a plurality of the photovoltaic modules of aspect 65.

Aspect 1A

A solar cell, wherein the solar cell comprises: a substrate, wherein the substrate comprises a surface and a first peripheral side surface; one or more busbar segments disposed on the surface and in proximity to the first peripheral side surface; an insulating layer overlying at least a portion of the first peripheral side surface; and an electrically conductive adhesive overlying at least a portion of the insulating layer and overlying at least a portion of each of the one or more busbar segments.

Aspect 2A

The solar cell of aspect 1A, wherein the surface comprises a frontside surface and the one or more busbar segments comprise one or more frontside busbar segments.

Aspect 3A

The solar cell of any one of aspects 1A to 2A, wherein the surface comprises a backside surface and the one or more busbar segments comprise one or more backside busbar segments.

Aspect 4A

The solar cell of any one of aspects 1A to 3A, wherein the substrate comprises a silicon substrate.

Aspect 5A

The solar cell of any one of aspects 1A to 4A, wherein the one or more busbar segments comprises two or more busbar segments.

Aspect 6A

The solar cell of any one of aspects 1A to 5A, further comprising a plurality of gridlines disposed on the surface, wherein each of the plurality of gridlines is interconnected to a busbar segment.

Aspect 7A

The solar cell of any one of aspects 1A to 6A, wherein the insulating layer overlies the entire first peripheral side surface.

Aspect 8A

The solar cell of any one of aspects 1A to 6A, wherein the electrically conductive adhesive overlies a substantial portion of the first peripheral side surface.

Aspect 9A

The solar cell of any one of aspects 1A to 8A, wherein the one or more busbar segments comprise a single busbar segment disposed on the surface and in proximity to the first peripheral side surface.

Aspect 10A

The solar cell of aspect 9A, wherein the single busbar segment spans a substantial length of the surface.

Aspect 11A

The solar cell of any one of aspects 9A to 10A, further comprising a plurality of gridlines disposed on the surface, wherein each of the plurality of gridlines is interconnected to a busbar segment.

Aspect 12A

The solar cell of any one of aspects 1A to 11A, wherein the first peripheral side surface comprises: two or more first portions, wherein each of the two or more first portions are commensurate with the one or more busbar segments; and one or more second portions, wherein each of the one or more second portions is adjacent a first portion or between two first portions.

Aspect 13A

The solar cell of aspect 12A, wherein the electrically conductive adhesive overlies each of the two or more first portions and overlies a busbar segment.

Aspect 14A

The solar cell of any one of aspects 12A to 13A, further comprising an elastomeric element overlying each of the second portions.

Aspect 15A

The solar cell of any one of aspects 12A to 13A, further comprising an elastomeric element overlying at least one of the second portions.

Aspect 16A

The solar cell of any one of aspects 1A to 15A, wherein the insulating layer comprises a dielectric material.

Aspect 17A

The solar cell of any one of aspects 1A to 16A, wherein the insulating layer has a thickness from 10 nm to 100 nm.

Aspect 18A

The solar cell of any one of aspects 1A to 17A, wherein the electrically conductive adhesive has a thickness from 3 μm to 100 μm.

Aspect 19A

The solar cell of any one of aspects 1A to 18A, wherein the electrically conductive adhesive comprises a blocked polyisocyanate prepolymer.

Aspect 20A

The solar cell of any one of aspects 1A to 19A, wherein the electrically conductive adhesive comprises a polyepoxide.

Aspect 21A

The solar cell of any one of aspects 1A to 20A, wherein the solar cell has a surface area less than 10,000 mm$^2$.

Aspect 22A

The solar cell of any one of aspects 1A to 20A, wherein the solar cell has a surface area from 500 mm$^2$ to 6,000 mm$^2$.

Aspect 23A

The solar cell of any one of aspects 1A to 22A, wherein the solar cell comprises a backside surface and the backside surface comprise an electrically conductive layer.

Aspect 24A

The solar cell of any one of aspects 1A to 22A, wherein, the surface comprises a frontside surface; the one or more busbar segments comprise one or more frontside busbar segments; and the solar cell further comprises: a backside surface and a second peripheral side surface; and one or more backside busbar segments disposed on the backside surface in proximity to the second peripheral side surface.

Aspect 25A

The solar cell of aspect 24A, further comprising a plurality of backside gridlines disposed on the backside surface and interconnected to the one or more backside busbar segments.

Aspect 26A

The solar cell of any one of aspects 24A to 25A, wherein, the first peripheral side surface comprises one or more first portions and one or more second portions; the one or more first portions are commensurate with one of the one or more busbar segments; and the electrically conductive adhesive is disposed on each of the one or more first portions.

Aspect 27A

The solar cell of any one of aspects 24A to 26A, further comprising: one or more second portions, wherein each of the one or more second portions is adjacent a first portion or between two first portions; and an elastomeric element disposed on at least one of the second portions.

Aspect 28A

The solar cell of any one of aspects 24A to 26A, further comprising: one or more second portions, wherein each of the one or more second portions is adjacent a first portion or between two first portions; and an elastomeric element disposed on each of the second portions.

Aspect 29A

The solar cell of any one of aspects 24A to 28A, wherein, the second peripheral side surface comprises one or more first portions and one or more second portions; the one or more first portions are in proximity to each of the one or more busbar segments; and the electrically conductive adhesive is disposed on each of the one or more first portions.

Aspect 30A

The solar cell of aspect 29A, further comprising an elastomeric element disposed on at least one of the second portions.

Aspect 31A

The solar cell of aspect 29A, further comprising an elastomeric element disposed on each of the second portions.

Aspect 32A

A photovoltaic module, comprising: a first solar cell of any one of aspects 24A to 31A comprising one or more first frontside busbar segments and a first electrically conductive adhesive; and a second solar cell of any one of aspects 24A to 31A comprising one or more second backside busbar segments and a second electrically conductive adhesive; wherein the first electrically conductive adhesive and the second electrically conductive adhesive are bonded and electrically interconnect the one or more first frontside busbar segments to the one or more second backside busbar segments.

Aspect 33A

A photovoltaic module, comprising: a first solar cell, wherein the first solar cell comprises a first frontside surface, a first backside surface, a first peripheral side surface, one or more frontside busbar segments disposed on the first frontside surface and in proximity to the first peripheral side surface, and a first insulating layer overlying the first peripheral side surface; a second solar cell, wherein the second solar cell comprises a second frontside surface, a second backside surface, a second peripheral side surface, one or more backside busbar segments disposed on the second backside surface and in proximity to the second peripheral side surface, and a second insulating layer overlying the second peripheral side surface; and an electrically conductive adhesive disposed on the first insulating layer and on the second insulating layer and overlying at least a portion of the one or more first frontside busbar segments and overlying at least a portion of the one or more backside busbar segments.

Aspect 34A

The photovoltaic module of aspect 33A, wherein, the first solar cell further comprises a plurality of first frontside gridlines disposed on the first surface and interconnected to the one or more frontside busbar segments; and the second solar cell further comprises a plurality of backside gridlines disposed on the second backside surface and interconnected to the one or more backside busbar segments.

Aspect 35A

The photovoltaic module of any one of aspects 33A to 34A, wherein the electrically conductive adhesive on the first peripheral side surface and the second peripheral side surface has a thickness from 5 µm to 200 µm.

Aspect 36A

The photovoltaic module of any one of aspects 33A to 35A, further comprising a mechanical support element overlying the electrically conductive adhesive disposed between the first solar cell and the second solar cell.

Aspect 37A

The photovoltaic module of any one of aspects 33A to 36A, wherein the electrically conductive adhesive spans the length of the first peripheral side surface and the length of the second peripheral side surface.

Aspect 38A

The photovoltaic module of any one of aspects 33A to 36A, wherein, the first peripheral side surface comprises one or more first portions wherein each of the one or more first portions is in proximity to each of the one or more frontside busbar segments, and the first peripheral side surface comprises one or more second portions wherein each of the one or more second portions adjoins one or more of the first portions; the second peripheral side surface comprises one or more first portions wherein each of the one or more first portions is in proximity to each of the one or more backside busbar segments, and the second peripheral side surface comprises one or more second portions wherein each of the one or more second portions adjoins one or more of the first portions; and the electrically conductive adhesive is bonded to and interconnects each of the one or more first portions of the first peripheral side surface to a respective one or more first portions of the second peripheral side surface.

Aspect 39A

The photovoltaic module of aspect 38A, further comprising an elastomeric element bonded to at least one of the one or more second portions of the first solar cell and to a respective one of the one or more second portions of the second solar cell.

Aspect 40A

The photovoltaic module of any one of aspects 38A to 39A, wherein the first solar cell and the second solar cell are coplanar.

Aspect 41A

A photovoltaic system comprising two or more photovoltaic modules of any one of aspects 32A to 40A.

Aspect 42A

A method of fabricating a solar cell interconnect, comprising: depositing an insulating layer overlying a peripheral side surface of a solar cell; and depositing an electrically conductive adhesive overlying at least a portion of the insulating layer and overlying at least a portion of each of one or more busbar segments to provide a solar cell interconnect.

Aspect 43A

The method of aspect 42A, further comprising, before depositing the insulating layer, cutting a large area solar cell to provide a plurality of small area solar cells, and the solar cell comprises a small area solar cell.

Aspect 44A

The method of any one of aspects 42A to 43A, wherein the small area solar cell has an area from 600 mm$^2$ to 10,000 mm$^2$.

Aspect 45A

The method of any one of aspects 42A to 44A, wherein depositing the insulating layer comprises additive manufacturing.

Aspect 46A

The method of any one of aspects 42A to 44A, wherein depositing the insulating layer comprises chemical vapor deposition.

Aspect 47A

The method of any one of aspects 42A to 46A, wherein depositing the electrically conductive adhesive comprises additive manufacturing.

Aspect 48A

A solar cell comprising an interconnect fabricated using the method of any one of aspects 42A to 47A.

Aspect 49A

A method of interconnecting solar cells, comprising: contacting a first electrically conductive adhesive of a first solar cell of any one of aspects 1A to 31A to a second electrically conductive adhesive of a second solar cell of any one of aspects 1A to 31A; and bonding the first electrically conductive adhesive to the second electrically conductive adhesive to interconnect the first solar cell and the second solar cell.

Aspect 50A

The method of aspect 49A, wherein, the first solar cell comprises one or more frontside busbar segments; the second solar cell comprises one or more backside busbar segments; and after bonding, the electrically conductive adhesive interconnects the one or more frontside busbar segments to the one or more backside busbar segments.

Aspect 51A

The method of any one of aspects 49A to 50A, wherein contacting comprises contacting a wet first electrically conductive adhesive to a wet second electrically conductive adhesive.

Aspect 52A

The method of aspect 51A, wherein bonding comprises curing the wet first electrically conductive adhesive and the wet second electrically conductive adhesive.

Aspect 53A

The method of aspect 52A, wherein curing comprises exposing the first wet electrically conductive adhesive and the second wet electrically conductive adhesive to a temperature from 150° C. to 250° C. for a duration from 20 minutes to 60 minutes.

Aspect 54A

The method of any one of aspects 52A to 53A, further comprising, prior to curing, drying the first wet electrically conductive adhesive and drying the second wet electrically conductive adhesive.

Aspect 55A

The method of aspect 54A, wherein drying comprises exposing the first wet electrically conductive adhesive and the second wet electrically conductive adhesive to a temperature from 100° C. to 200° C. for a duration from 5 minutes to 20 minutes.

Aspect 56A

Solar cells interconnected using the method of any one of aspects 49A to 55A.

Aspect 57A

A photovoltaic module comprising the solar cells of aspect 56A.

Aspect 58A

A power system comprising a plurality of the photovoltaic modules of aspect 57A.

Aspect 59A

A solar cell comprising: a substrate comprising a frontside surface, a backside surface, a first peripheral side surface, and a second peripheral side surface; a side surface insulating layer overlying the first peripheral side surface; a backside insulating layer overlying a portion of the backside surface in proximity to the first peripheral side surface; one or more frontside busbar segments overlying the backside insulating layer; and a plurality of frontside gridlines disposed on the frontside surface and interconnected to the one or more frontside busbar segments.

Aspect 60A

The solar cell of aspect 59A, wherein each of the plurality of frontside gridlines is disposed on the side surface insulating layer and is interconnected to the one or more frontside busbar segments.

Aspect 61A

The solar cell of any one of aspects 59A to 60A, wherein, each of the one or more frontside busbar segments is disposed on the first peripheral side surface; and each of the plurality of frontside gridlines is interconnected to the one or more frontside busbar segments.

Aspect 62A

The solar cell of any one of aspects 59A to 60A, further comprising: one or more backside busbar segments disposed on the backside surface in proximity to the second peripheral side surface; and a plurality of backside gridlines disposed on the backside surface and interconnected to the one or more backside busbar segments.

Aspect 63A

A photovoltaic module, comprising: a first solar cell of any one of aspects 59A to 62; a second solar cell of any one of aspects 59A to 62A; an interconnection element interconnecting the one or more frontside busbar segments of the first solar cell to the one or more backside busbar segments of the second solar cell.

Aspect 64A

The photovoltaic module of aspect 63A, wherein the interconnection element comprises a conductive tab.

Aspect 65A

A power system comprising a plurality of the photovoltaic modules of aspect 64A.

Aspect 66A

A method of fabricating a solar cell interconnect comprising: applying an insulating layer to a peripheral side surface of a solar cell; and extending gridlines on a frontside surface of the solar cell over the insulating layer and onto one or more busbar segments on a backside surface of the solar cell.

Aspect 67A

The method of aspect 66A, wherein extending the gridlines comprises depositing an electrically conductive adhesive on the insulating layer and interconnecting the gridlines and the one or more busbar segments.

Aspect 68A

A solar cell comprising an interconnect made by the method of any one of aspects 66A to 67A.

Aspect 69A

A solar cell module comprising a first solar cell of aspect 68A interconnected to a second solar cell of aspect 68A Finally, it should be noted that there are alternative ways of implementing the embodiments disclosed herein. Accordingly, the present embodiments are to be considered as illustrative and not restrictive. Furthermore, the claims are not to be limited to the details given herein and are entitled to their full scope and equivalents thereof.

What is claimed is:

1. A solar cell, wherein the solar cell comprises:
a substrate, wherein the substrate comprises a surface and a first peripheral side surface;
one or more busbar segments disposed on the surface and in proximity to the first peripheral side surface;
an insulating layer overlying at least a portion of the first peripheral side surface; and
an electrically conductive adhesive overlying at least a portion of the insulating layer and overlying at least a portion of each of the one or more busbar segments.

2. The solar cell of claim 1, wherein the surface comprises a frontside surface and the one or more busbar segments comprise one or more frontside busbar segments.

3. The solar cell of claim 1, further comprising a plurality of gridlines disposed on the surface, wherein each of the plurality of gridlines is interconnected to a busbar segment.

4. The solar cell of claim 1, wherein the first peripheral side surface comprises:
two or more first portions, wherein each of the two or more first portions are commensurate with the one or more busbar segments; and
one or more second portions, wherein each of the one or more second portions is adjacent a first portion or between two first portions.

5. The solar cell of claim 4, wherein the electrically conductive adhesive overlies each of the two or more first portions and overlies a busbar segment.

6. The solar cell of claim 4, further comprising an elastomeric element overlying at least one of the second portions.

7. The solar cell of claim 1, wherein the solar cell has a surface area less than 10,000 mm$^2$.

8. The solar cell of claim 1, wherein,
the surface comprises a frontside surface;
the one or more busbar segments comprise one or more frontside busbar segments; and
the solar cell further comprises:
a backside surface and a second peripheral side surface; and
one or more backside busbar segments disposed on the backside surface in proximity to the second peripheral side surface.

9. A photovoltaic module, comprising:
a first solar cell claim 8 comprising one or more first frontside busbar segments and a first electrically conductive adhesive; and
a second solar cell of claim 8 comprising one or more second backside busbar segments and a second electrically conductive adhesive;
wherein the first electrically conductive adhesive and the second electrically conductive adhesive are bonded and electrically interconnect the one or more first frontside busbar segments to the one or more second backside busbar segments.

10. A photovoltaic system comprising two or more photovoltaic modules of claim 9.

11. A photovoltaic module, comprising:
a first solar cell, wherein the first solar cell comprises a first frontside surface, a first backside surface, a first peripheral side surface, one or more frontside busbar segments disposed on the first frontside surface and in proximity to the first peripheral side surface, and a first insulating layer overlying the first peripheral side surface;
a second solar cell, wherein the second solar cell comprises a second frontside surface, a second backside surface, a second peripheral side surface, one or more backside busbar segments disposed on the second backside surface and in proximity to the second peripheral side surface, and a second insulating layer overlying the second peripheral side surface; and
an electrically conductive adhesive disposed on the first insulating layer and on the second insulating layer and overlying at least a portion of the one or more first frontside busbar segments and overlying at least a portion of the one or more backside busbar segments.

12. The photovoltaic module of claim 11, wherein,
the first solar cell further comprises a plurality of first frontside gridlines disposed on the first surface and interconnected to the one or more frontside busbar segments; and
the second solar cell further comprises a plurality of backside gridlines disposed on the second backside surface and interconnected to the one or more backside busbar segments.

13. The photovoltaic module of claim 11, wherein,
the first peripheral side surface comprises one or more first portions wherein each of the one or more first portions is in proximity to each of the one or more frontside busbar segments, and the first peripheral side surface comprises one or more second portions wherein each of the one or more second portions adjoins one or more of the first portions;
the second peripheral side surface comprises one or more first portions wherein each of the one or more first portions is in proximity to each of the one or more backside busbar segments, and the second peripheral side surface comprises one or more second portions wherein each of the one or more second portions adjoins one or more of the first portions; and
the electrically conductive adhesive is bonded to and interconnects each of the one or more first portions of the first peripheral side surface to a respective one or more first portions of the second peripheral side surface.

14. The photovoltaic module of claim 13, further comprising an elastomeric element bonded to at least one of the one or more second portions of the first solar cell and to a respective one of the one or more second portions of the second solar cell.

15. A photovoltaic system comprising two or more photovoltaic modules of claim 11.

16. A method of interconnecting solar cells, comprising:
contacting a first electrically conductive adhesive of a first solar cell of claim 1 to a second electrically conductive adhesive of a second solar cell of claim 2; and
bonding the first electrically conductive adhesive to the second electrically conductive adhesive to interconnect the first solar cell and the second solar cell.

17. Solar cells interconnected using the method of claim 16.

18. A photovoltaic module comprising the solar cells of claim 17.

19. A power system comprising a plurality of the photovoltaic modules of claim 18.

* * * * *